United States Patent
You

(10) Patent No.: US 12,232,367 B2
(45) Date of Patent: Feb. 18, 2025

(54) DISPLAY DEVICE INCLUDING SWELLING PREVENTION LAYER

(71) Applicant: SAMSUNG DISPLAY CO., LTD., Yongin-si (KR)

(72) Inventor: Chun Gi You, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 407 days.

(21) Appl. No.: 17/655,117

(22) Filed: Mar. 16, 2022

(65) Prior Publication Data

US 2023/0059622 A1    Feb. 23, 2023

(30) Foreign Application Priority Data

Aug. 23, 2021 (KR) .......................... 10-2021-0111074

(51) Int. Cl.
*H10K 59/12* (2023.01)
*H10K 50/816* (2023.01)
(Continued)

(52) U.S. Cl.
CPC ......... *H10K 59/122* (2023.02); *H10K 50/816* (2023.02); *H10K 50/844* (2023.02);
(Continued)

(58) Field of Classification Search
CPC ............... H10K 50/816; H10K 50/844; H10K 50/865; H10K 50/82; H10K 50/818;
(Continued)

(56) References Cited

U.S. PATENT DOCUMENTS 6,825,061 B2 * 11/2004 Hokari .................. H10K 71/15
257/40
8,481,992 B2 *  7/2013 Kho ....................... H10K 50/00
257/40
(Continued)

FOREIGN PATENT DOCUMENTS

EP         3496150 A1 *  6/2019   ......... H01L 27/3246
KR       100694943       3/2007
KR    1020210022206     3/2021

*Primary Examiner* — Ida M Soward
(74) *Attorney, Agent, or Firm* — F. CHAU & ASSOCIATES, LLC

(57) ABSTRACT

A display device includes a substrate, a thin-film transistor disposed on the substrate, a via insulating layer disposed above the thin-film transistor, a first electrode disposed on the via insulating layer and electrically connected to the thin-film transistor, a pixel-defining layer disposed on the via insulating layer and on the first electrode and that includes an opening that partially exposes an upper surface of the first electrode; and a first swelling prevention layer disposed on one end of the upper surface of the first electrode and interposed between the first electrode and the pixel-defining layer. The pixel-defining layer comprises a first region that overlaps the first swelling prevention layer and the first electrode, and a second region that overlaps the first electrode but not the first swelling prevention layer. The second region of the pixel-defining layer is in direct contact with the upper surface of the first electrode.

20 Claims, 35 Drawing Sheets

(51) Int. Cl.
*H10K 50/84* (2023.01)
*H10K 50/844* (2023.01)
*H10K 59/122* (2023.01)
*H10K 71/00* (2023.01)
*H10K 50/818* (2023.01)
*H10K 50/86* (2023.01)
*H10K 59/40* (2023.01)
*H10K 102/10* (2023.01)

(52) U.S. Cl.
CPC ........... *H10K 71/00* (2023.02); *H10K 50/818* (2023.02); *H10K 50/865* (2023.02); *H10K 59/1201* (2023.02); *H10K 59/40* (2023.02); *H10K 2102/103* (2023.02)

(58) Field of Classification Search
CPC .......... H10K 59/122; H10K 59/80517; H10K 59/10; H10K 59/123; H10K 59/124; H10K 59/40
See application file for complete search history.

(56) References Cited

U.S. PATENT DOCUMENTS

| | | | |
|---|---|---|---|
| 9,041,888 B2* | 5/2015 | Moriwaki | H10K 50/11 349/122 |
| 2003/0189210 A1* | 10/2003 | Yamazaki | H01L 27/1248 257/E27.113 |
| 2005/0110020 A1* | 5/2005 | Hayashi | H10K 59/872 257/E27.111 |
| 2005/0186698 A1* | 8/2005 | Ishida | H10K 59/122 438/99 |
| 2014/0319477 A1* | 10/2014 | Kim | H10K 59/122 438/34 |
| 2015/0263081 A1* | 9/2015 | Song | H10K 59/8052 438/34 |
| 2015/0333111 A1* | 11/2015 | Sato | H10K 59/871 257/40 |
| 2021/0020869 A1* | 1/2021 | Xie | H10K 59/879 |
| 2021/0057504 A1* | 2/2021 | Ko | H10K 71/00 |

* cited by examiner

DISPLAY DEVICE INCLUDING SWELLING PREVENTION LAYER

This application claims priority under 35 U.S.C. § 119 from Korean Patent Application No. 10-2021-0111074, filed on Aug. 23, 2021 in the Korean Intellectual Property Office, the contents of which are herein incorporated by reference in their entirety.

BACKGROUND

1. Technical Field

Embodiments of the disclosure are directed to a display device and a method of fabricating the same.

2. Discussion of the Related Art

Display devices have acquired more uses as multimedia technology evolves. In response, a variety of types of display devices that include self-luminous display devices, such as organic light-emitting display (OLED) devices, and non-self-luminous display devices, such as liquid-crystal display (LCD) devices, are being used.

Among them, many organic light-emitting display devices use a top-emission structure in which images are displayed on a side on which an encapsulation member is located. In this structure, a reflective electrode is further disposed under a transparent anode of the organic light-emitting display device.

SUMMARY

Embodiments of the disclosure provide a display device that increases a reliability and a display quality of organic light-emitting elements, and a method of fabricating the display device.

According to an embodiment of the disclosure, a display device includes a substrate, a thin-film transistor disposed on the substrate, a via insulating layer disposed above the thin-film transistor, a first electrode disposed on the via insulating layer and electrically connected to the thin-film transistor; a pixel-defining layer disposed on the via insulating layer and on the first electrode, where the pixel-defining layer includes an opening that partially exposes an upper surface of the first electrode; and a first swelling prevention layer disposed on one end of the upper surface of the first electrode and interposed between the first electrode and the pixel-defining layer. The pixel-defining layer includes a first region that overlaps the first swelling prevention layer and the first electrode, and a second region that overlaps the first electrode but not the first swelling prevention layer. The second region of the pixel-defining layer is in direct contact with the upper surface of the first electrode, and wherein a part of the upper surface of the first electrode in contact with the pixel-defining layer is made of a material that differs from a material of the first swelling prevention layer.

The first electrode includes a first layer disposed on the via insulating layer, a second layer disposed on the first layer, and a third layer disposed on the second layer. The first layer and the third layer include a transparent conductive oxide, the second layer includes a reflective metal, and the first swelling prevention layer is made of a material that differs from a material of the third layer.

The first layer and the third layer include indium tin oxide, the second layer includes silver (Ag), and the first swelling prevention layer includes one of indium zinc oxide or indium gallium zinc oxide.

The pixel-defining layer includes a light-absorbing material.

An angle formed between an upper surface of the third layer and a tangent line at a point where an upper surface of the pixel-defining layer makes direct contact with the upper surface of the third layer is greater than 0° and less than or equal to 10°.

The third layer includes a pin hole that penetrates through the third layer, and the display device further includes a second swelling prevention layer disposed inside the pin hole.

A second swelling prevention layer is made of a material that differs from the material of the third layer.

A surface of the pixel-defining layer adjacent to the opening has a profile that includes an inflection point.

The pixel-defining layer includes a slope increasing region in which a slope of an upper surface of the pixel-defining layer increases toward the first electrode, and a slope decreasing region in which the slope of the upper surface of the pixel-defining layer decreases toward the first electrode. The slope decreasing region is disposed between the slope increasing region and the opening and is disposed closer to a center of the first electrode, and the inflection point is a boundary between the slope increasing region and the slope decreasing region.

An angle formed between the upper surface of the first electrode and a tangent line at a point of contact of the upper surface of the pixel-defining layer and the upper surface of the first electrode where an end of the slope decreasing region is in direct contact with the upper surface of the first electrode is greater than 0° and less than or equal to 10°.

According to an embodiment of the disclosure, a display device includes a substrate, a thin-film transistor disposed on the substrate, a via insulating layer disposed above the thin-film transistor, a first electrode disposed on the via insulating layer and electrically connected to the thin-film transistor, and a pixel-defining layer disposed on the via insulating layer and on a part of an upper surface of the first electrode. The first electrode includes a first layer disposed on the via insulating layer, a second layer disposed on the first layer, and a third layer disposed on the second layer. The third layer includes a plurality of pin holes that penetrate through the third layer, and the display device includes a first swelling prevention layer disposed inside the plurality of pin holes of the third layer.

The third layer and the first swelling prevention layer are made of different materials.

A first layer and the third layer include indium tin oxide, the second layer includes silver (Ag), and the first swelling prevention layer includes one of indium zinc oxide or indium gallium zinc oxide.

The pixel-defining layer includes a light-absorbing material.

An emissive layer is disposed on the third layer. The plurality of pin holes include a first pin hole that overlaps the emissive layer but not the pixel-defining layer, and the first pin hole is filled with the first swelling prevention layer and a part of the emissive layer.

The plurality of pin holes includes a second pin hole that overlaps the pixel-defining layer, the pixel-defining layer includes a first pixel-defining layer in contact with an upper surface of the third layer and a second pixel-defining layer disposed inside the second pin hole, and the second pin hole is filled with the first swelling prevention layer and the second pixel-defining layer.

A second swelling prevention layer is disposed between the third layer and the pixel-defining layer and is located at both ends of the upper surface of the third layer. The plurality of pin holes include a third pin hole that overlaps the second swelling prevention layer, and the first swelling prevention layer disposed inside the third pin hole is integrally connected with the second swelling prevention layer.

According to an embodiment of the disclosure, a display device includes a substrate, a thin-film transistor disposed on the substrate, a via insulating layer disposed above the thin-film transistor, a first electrode disposed on the via insulating layer and electrically connected to the thin-film transistor, and a pixel-defining layer disposed on the via insulating layer and on the first electrode and that includes an opening that partially exposes a part of an upper surface of the first electrode. An upper surface of the pixel-defining layer adjacent to the opening has a profile having an inflection point.

The pixel-defining layer includes a slope increasing region in which a slope of the upper surface of the pixel-defining layer increases toward the first electrode, and a slope decreasing region in which the slope of the upper surface of the pixel-defining layer decreases toward the first electrode. The slope decreasing region is disposed between the slope increasing region and the opening and is disposed closer to a center of the first electrode, and the inflection point is a boundary between the slope increasing region and the slope decreasing region.

An angle formed between the upper surface of the first electrode and a line tangent to the upper surface of the pixel-defining layer at a point of contact between the of the upper surface of the pixel-defining layer and the upper surface of the first electrode where an end of the slope decreasing region is in direct contact with the upper surface of the first electrode is greater than 0° and less than or equal to 10°.

DETAILED DESCRIPTION

Embodiments of the present disclosure will now be described more fully hereinafter with reference to the accompanying drawings, in which some embodiments of the disclosure are shown. This disclosure may, however, be embodied in different forms and should not be construed as limited to embodiments set forth herein. Rather, embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers may indicate the same components throughout the specification.

Hereinafter, embodiments of the disclosure will be described with reference to the accompanying drawings.

Figure 1:
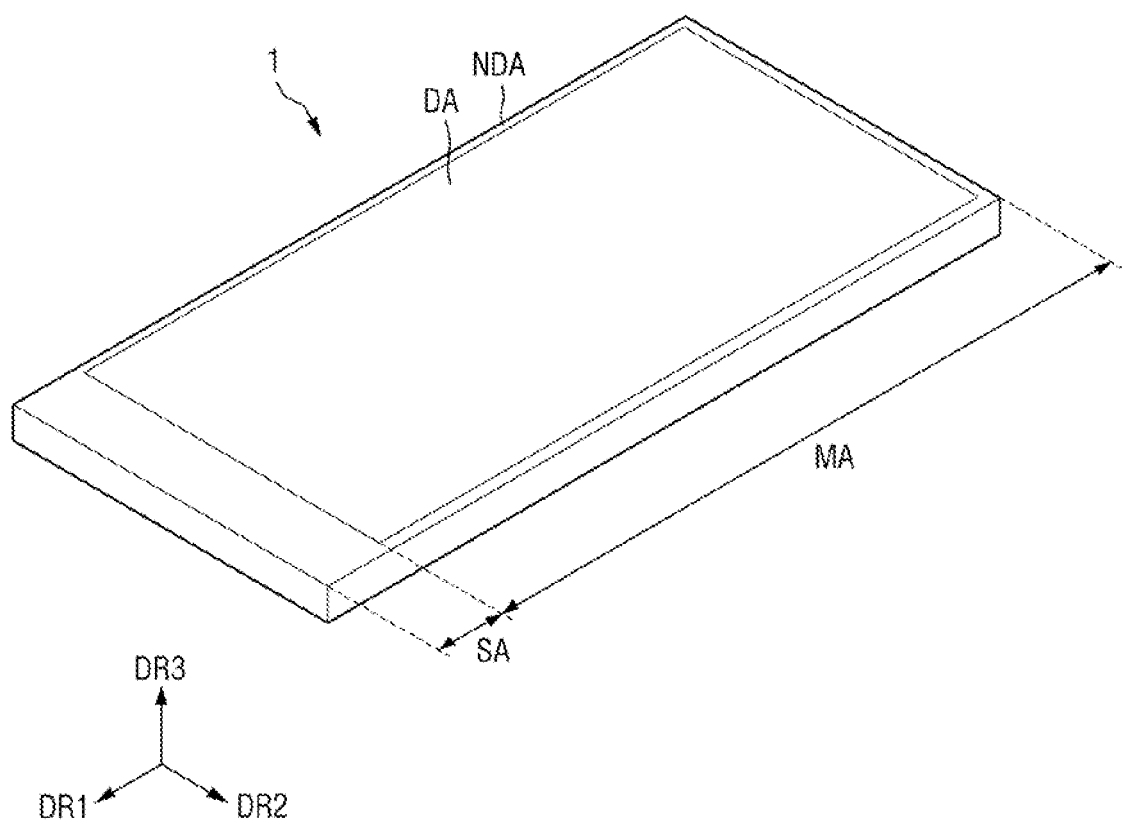
FIG. 1 is a plan view of a display device according to an embodiment of the disclosure.
Figure 2:
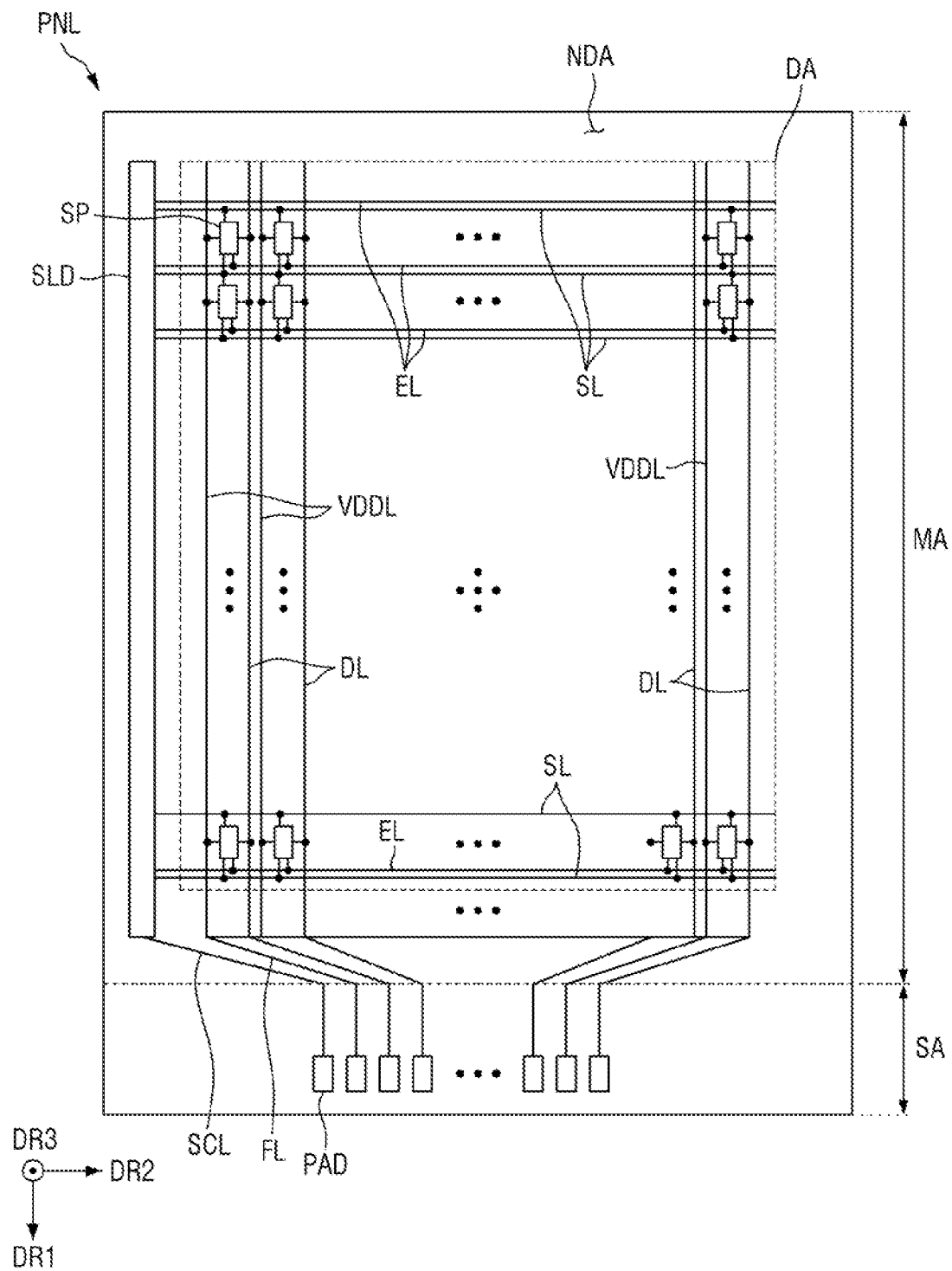
FIG. 2 is a plan view of the circuit structure of a display device according to an embodiment of FIG. 1.

FIG. 1 is a plan view of a display device according to an embodiment of the disclosure. FIG. 2 is a plan view of the circuit structure of a display device according to the embodiment of FIG. 1.

Referring to FIGS. 1 and 2, a display device 1 according to an embodiment is a device that displays moving images or still images, and may be any electronic device that provides a display screen. The display device 1 may be a portable electronic device that provides a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console or a digital camera, as well as a television set, a laptop computer, a monitor, an electronic billboard, or an Internet of Things device, etc.

The display device 1 has a three-dimensional shape. In the drawings, a direction parallel to a first side of the display device 1 is referred to as a first direction DR1, the direction parallel to a second side of the display device 1 is referred to as a second direction DR2, and the thickness direction of the display device 1 is referred to as a third direction DR3. As used herein, a direction may refer to a direction toward one side or the opposite side unless specifically stated otherwise. In FIG. 1, the side indicated by the arrow of a direction is referred to as one side in the direction, while the opposite side is referred to as the opposite side in the direction. The first direction DR1 and the second direction DR2 may intersect each other or may be perpendicular to each other. The second direction DR2 and the third direction DR3 may intersect each other or may be perpendicular to each other. The first direction DR1 and the third direction DR3 may intersect each other or may be perpendicular to each other. The first direction may correspond to a vertical direction, and the second direction may correspond to the horizontal direction.

In some embodiments, the display device 1 has a rectangular shape in which the vertical sides are longer than the horizontal sides when viewed from the top as shown in FIG. 1, but embodiments of the disclosure is not limited thereto. For example, the corners where the first sides and the second sides of the display device 1 meet may be rounded with a predetermined curvature, or the shape may not be limited to a rectangular shape but may have another polygonal shape, a circular shape, or an oval shape.

The display device 1 according to an embodiment includes a display panel PNL.

The display panel PNL displays images thereon. Any kind of display panel may be used as the display panel PNL according to an embodiment, such as an organic light-emitting display panel that includes an organic light-emitting layer, a micro light-emitting diode display panel that uses micro LEDs, a quantum-dot light-emitting display panel that uses quantum-dot light-emitting diodes that include a quantum-dot light-emitting layer, or an inorganic light-emitting display panel that uses inorganic light-emitting elements that include an inorganic semiconductor. Referring to FIG. 1, the display panel PNL displays images on one side toward the third direction DR3.

In some embodiments, the display panel PNL includes a main area MA and a subsidiary area SA located on one side of the main area.

The main area MA has a shape generally similar to the appearance of the display device 1 when viewed from the top. The main area MA is a flat area located in one plane.

The subsidiary area SA extends in the first direction DR1 from the main area MA. The width of the subsidiary area SA in the second direction DR2 may be, but is not limited to, equal to the width of the main area MA in the second direction DR2. For example, the width of the subsidiary area SA in the second direction DR2 may be less than the width of the main area MA in the second direction DR2. A plurality of pads that are electrically connected to a circuit board that provides a control signal to the display device 1 are disposed in the subsidiary area SA.

The display panel PNL includes a display area DA where images are displayed, and a non-display area NDA where no image is displayed. The display area DA of the display panel PNL is disposed in the main area MA. Specifically, the display area DA is located in the center portion of the main area MA, but not the edge portions.

The non-display area NDA surrounds the display area DA. For example, the remaining portion of the display panel PNL that excludes the display area DA becomes the non-display area NDA of the display panel PNL. In an embodiment, the border of the display area DA of the main area MA and the entire subsidiary area SA form the non-display area NDA. However, embodiments of the disclosure are not limited thereto. In an embodiment, the subsidiary area SA also includes the display area DA.

In the display area DA, a plurality of sub-pixels SP, as well as first supply voltage lines VDDL, data lines DL, scan lines SL, and emission lines EL connected to the plurality of sub-pixels SP, are disposed.

The first supply voltage lines VDDL transmit the supply voltage to the sub-pixels SP. In some embodiments, the first supply voltage lines VDDL extend parallel to each other in the first direction DR1 and are spaced apart from each other in the second direction DR2 in the display area DA. In some embodiments, the first supply voltage lines VDDL are connected to each other in the non-display area NDA. In addition, in some embodiments, supply voltage lines that extend in the second direction DR2 and connect to the first supply voltage lines VDDL are further disposed in the display area DA.

The data lines DL transmit data signals to the sub-pixels SP. In some embodiments, the data lines DL extend in the first direction DR1 parallel to the first supply voltage lines VDDL, are spaced apart from each other in the second direction DR2.

The scan lines SL transmit scan signals to the sub-pixels SP. In some embodiments, the scan lines SL extend parallel to each other in the second direction DR2 and cross the first supply voltage lines VDDL and the data lines DL, and are spaced apart from each other in the first direction DR1.

The emission lines EL transmit voltages to the sub-pixels SP for emitting light. In some embodiments, the emission lines EL extend in the second direction DR2 parallel to the scan lines SL, and are spaced apart from each other in the first direction DR1.

The sub-pixels SP receive signals from the first supply voltage lines VDDL, the data lines DL, the scan lines SL and the emission lines EL, and emit light to output images in the display area DA. Each of the sub-pixels SP is connected to at least one of the first supply voltage lines VDDL, at least one of the scan lines SL, at least one of the data lines DL, and at least one of the emission lines EL. In the example shown in FIG. 2, each of the sub-pixels SP is connected to two scan lines SL, one data line DL, one emission line EL, and the first supply voltage line VDDL. However, embodiments of the disclosure are not limited thereto. In an embodiment, each of the sub-pixels SP is connected to three scan lines SL rather than two scan lines SL.

A scan driver SLD, fan-out lines FL and pads PAD are disposed in the non-display area NDA.

The scan driver SLD transmits scan signals to the scan lines SL and transmits emission signals to the emission lines EL. The scan driver SLD is disposed on one side of the non-display area NDA of the main area MA in the second direction DR2, but embodiments of the disclosure are not limited thereto. In an embodiment, the scan driver SLD is disposed on both sides of the non-display area NDA of the main area MA in the second direction DR2. In addition, the scan driver SLD generates both a scan output signal and an emission output signal. The scan output signal output generates scan signals and sequentially outputs the scan signals to the scan lines SL. The emission output signal generates emission signals and sequentially outputs the emission signals to the emission lines EL.

The scan driver SLD receives a scan control signal and an emission control signal from a scan control line SCL. The scan control line SCL receives the scan control signal and the emission control signal from a display driver circuit.

The fan-out lines FL electrically connect the data lines DL with the pads PAD of the subsidiary area SA. As described above, when the width of the subsidiary area SA in the second direction DR2 is less than the width of the main area MA in the second direction DR2, the fan-out lines FL converge on the central portion of the subsidiary area SA in the second direction DR2.

The pads PAD are electrically connected to a circuit board to be described below and receive a control signal from the circuit board and transmit it to the display panel PNL. The plurality of pads PAD are disposed at one end of the subsidiary area SA in the first direction DR1 and are arranged side by side in the second direction DR2 at a predetermined interval.

In addition, the display device 1 further includes a circuit board, and the pads PAD are electrically connected to the circuit board. The circuit board supplies a power signal and various control signals to the display panel PNL. The circuit board is disposed at one end of the subsidiary area SA in the first direction DR1 and is electrically connected to the pads PAD.

Figure 3:
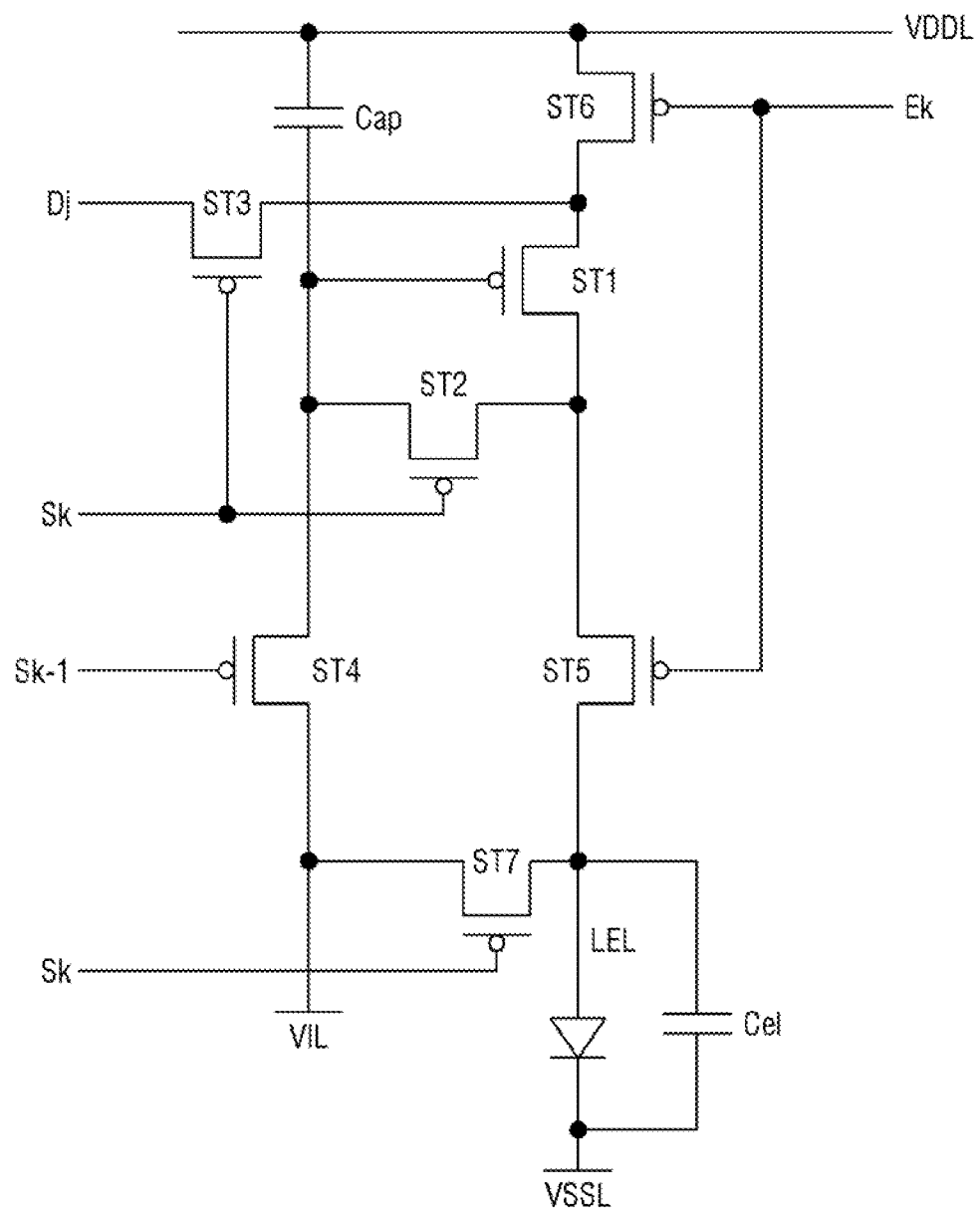
FIG. 3 is a circuit diagram of a circuit structure of a sub-pixel according to an embodiment of FIG. 1.
Figure 4:
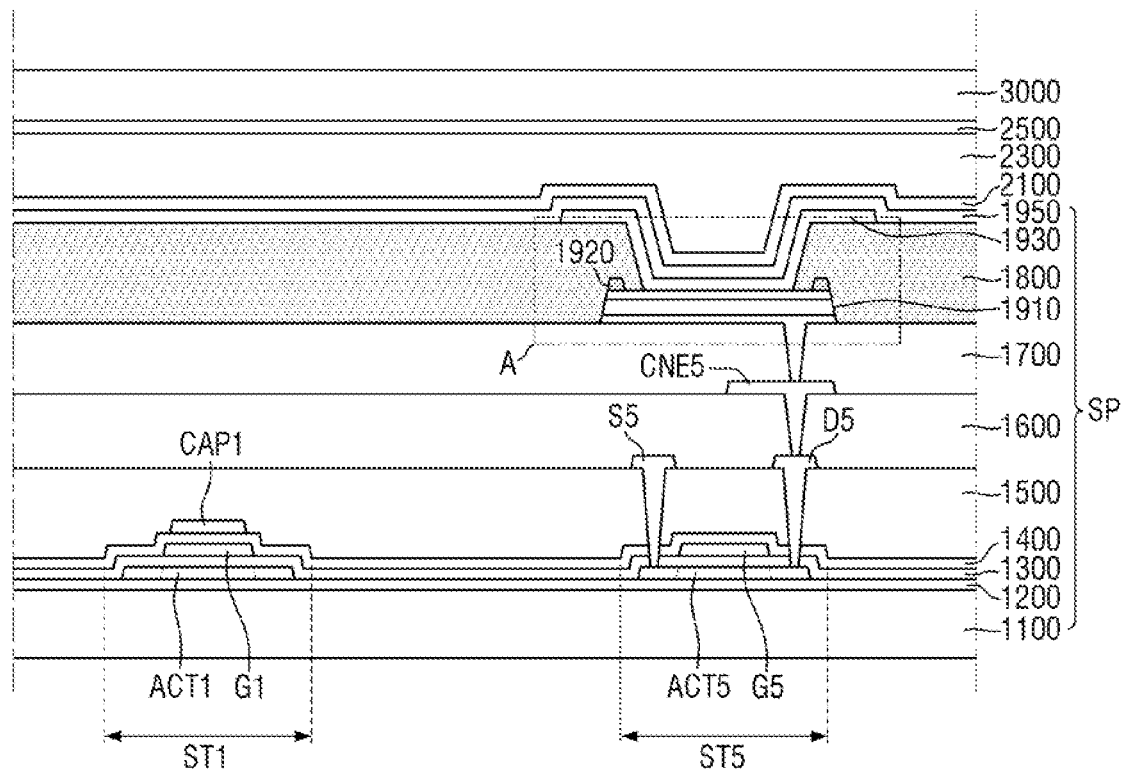
FIG. 4 is a structural diagram of a part of a sub-pixel of FIG. 1.
Figure 5:
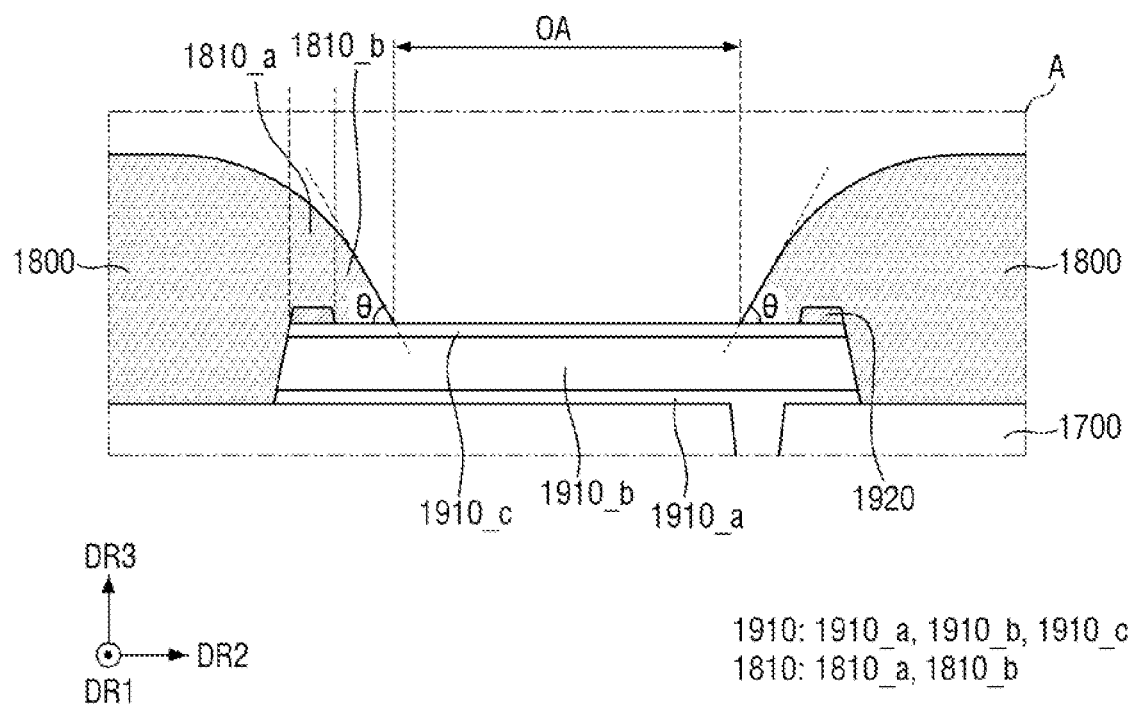
FIG. 5 is an enlarged view of area A of FIG. 4.

FIG. 3 is a circuit diagram s of a sub-pixel according to the embodiment of FIG. 1. FIG. 4 is a structural diagram of a part of a sub-pixel of FIG. 1. FIG. 5 is an enlarged view of area A of FIG. 4.

Referring to FIG. 3, in an embodiment, the sub-pixel SP is connected to the $(k-1)^{th}$ scan line $S(k-1)$, the $k^{th}$ scan line Sk, and the $j^{th}$ data line Dj, where k and j are natural numbers equal to or greater than one. In addition, the sub-pixel SP is connected to a first supply voltage line VDDL from which a first supply voltage is received, an initialization voltage line VIL from which an initialization voltage is received, and a second supply voltage line VSSL from which a second supply voltage lower than the first supply voltage is received. In addition, the sub-pixel SP includes a thin-film transistor, a light-emitting element LEL, and a capacitor. The thin-film transistor includes a driving transistor DT and a switching transistor SW. The driving transistor DT receives the first supply voltage or the second supply voltage and transmits a driving current to the light-emitting element LEL, and the switching transistor SW transmits a data signal to the driving transistor DT. The sub-pixel SP includes a first thin-film transistor ST1 as the driving transistor DT, a second thin-film transistor ST2, a third thin-film transistor ST3, a fourth thin-film transistor ST4, a fifth thin-film transistor ST5, a sixth thin-film transistor ST6 and a seventh thin-film transistor as the switching transistors SW, and a first electrode, a second electrode and an emissive layer as the light-emitting element LEL.

The first thin-film transistor ST1 includes a first gate electrode, a first semiconductor pattern layer, a first electrode, a second electrode, etc. The first thin-film transistor ST1 controls a drain-source current that flows between the first electrode and the second electrode in response to the data voltage applied to the first gate electrode. The driving current that flows through the channel of the first thin-film transistor ST1 is proportional to the square of the difference between the threshold voltage and the voltage between the first gate electrode and the first electrode of the first thin-film transistor ST1 as shown in Equation 1 below:

$$Ids = k' \times (Vgs - Vth)^2 \qquad (1)$$

where k' denotes a proportionality coefficient determined by the structure and physical properties of the first thin-film transistor ST1, Vgs denotes the gate-source voltage of the first thin-film transistor ST1, Vth denotes the threshold voltage of the first thin-film transistor ST1, and Ids denotes the driving current.

The light-emitting element LEL emits light in response to the driving current. The amount of light emitted from the light-emitting element LEL is proportional to the driving current. The light-emitting element LEL includes a first electrode, a second electrode, and an emissive layer (1930 in FIG. 4) disposed between the first electrode and the second electrode. The first electrode is an anode electrode, and the second electrode is a cathode electrode.

The first electrode of the light-emitting element LEL is connected to the first electrode of the seventh transistor ST7 and the second electrode of the fifth thin-film transistor ST5, while the second electrode may be connected to the second supply voltage line VSSL.

The second thin-film transistor ST2 is turned on by the scan signal of the $k^{th}$ scan line Sk and connects the first gate electrode with the second electrode of the first thin-film transistor ST1. Specifically, when the second thin-film transistor ST2 is turned on, the first gate electrode and the second electrode of the first thin-film transistor ST1 are connected, and accordingly the first thin-film transistor ST1 is driven as a diode. The second thin-film transistor ST2 includes a second gate electrode, a second semiconductor pattern layer, a first electrode, and a second electrode. The second gate electrode is connected to the $k^{th}$ scan line Sk, the first electrode of the second thin-film transistor ST2 is connected to the second electrode of the first thin-film transistor ST1, and the second electrode of the second thin-film transistor ST2 is connected to the first gate electrode of the first thin-film transistor ST1.

The third thin-film transistor ST3 is turned on by the scan signal of the $k^{th}$ scan line Sk and connects the first electrode of the first thin-film transistor ST1 with the $j^{th}$ data line Dj. The third thin-film transistor ST3 includes a third gate electrode, a third semiconductor pattern layer, a first electrode, and a second electrode. The third gate electrode of the third thin-film transistor ST3 is connected to the $k^{th}$ scan line Sk, the first electrode of the third thin-film transistor ST3 is connected to the first electrode of the first thin-film transistor ST1, and the second electrode of the third thin-film transistor ST3 is connected to the $j^{th}$ data line Dj.

The fourth thin-film transistor ST4 is turned on by the scan signal of the $(k-1)^{th}$ scan line $S(k-1)$ and connects the first gate electrode of the first thin-film transistor ST1 with the initialization voltage line VIL. The first gate electrode of the first thin-film transistor ST1 discharges to the initialization voltage of the initialization voltage line VIL. The fourth thin-film transistor ST4 includes a fourth gate electrode, a fourth semiconductor pattern layer, a first electrode, and a second electrode. The fourth gate electrode of the fourth thin-film transistor ST4 is connected to the $(k-1)^{th}$ scan line $S(k-1)$, the first electrode of the fourth thin-film transistor ST4 is connected to the first electrode of the first thin-film transistor ST1, and the second electrode of the fourth thin-film transistor ST4 is connected to the initialization voltage line VIL.

The fifth thin-film transistor ST5 is connected between the second electrode of the first thin-film transistor ST1 and the first electrode of the light-emitting element LEL. The fifth transistor ST5 is turned on by the emission control signal of the $k^{th}$ emission line Ek and connects the second electrode of the first thin-film transistor ST1 with the first electrode of the light-emitting element LEL. The fifth thin-film transistor ST5 includes a fifth gate electrode, a fifth semiconductor pattern layer, a first electrode, and a second electrode. The fifth gate electrode of the fifth thin-film transistor ST5 is connected to the $k^{th}$ emission line Ek, the first electrode is the fifth thin-film transistor ST5 is connected to the second electrode of the first thin-film transistor ST1, and the second electrode of the fifth thin-film transistor ST5 is connected to the first electrode of the light-emitting element LEL.

The sixth thin-film transistor ST6 is turned on by the emission control signal of the $k^{th}$ emission line Ek and connects the first electrode of the first thin-film transistor ST1 with the first supply voltage line VDDL. The sixth thin-film transistor ST6 includes a sixth gate electrode, a sixth semiconductor pattern layer, a first electrode, and a second electrode. The sixth gate electrode of the sixth thin-film transistor ST6 is connected to the $k^{th}$ emission line Ek, the first electrode of the sixth thin-film transistor ST6 is connected to the first supply voltage line VDDL, and the second electrode of the sixth thin-film transistor ST6 is connected to the first electrode of the first thin-film transistor ST1. When the fifth thin-film transistor ST5 and the sixth thin-film transistor ST6 are both turned on, the driving current can be supplied to the light-emitting element LEL.

The seventh thin-film transistor ST7 is turned on by the scan signal of the $k^{th}$ scan line Sk and connects the first electrode of the light-emitting element LEL with the initialization voltage line VIL. The first electrode of the light-emitting element LEL discharges to the initializing voltage. The seventh thin-film transistor ST7 includes a seventh gate electrode, a seventh semiconductor pattern layer, a first electrode, and a second electrode. The seventh gate electrode of the seventh thin-film transistor ST7 is connected to the $k^{th}$ scan line Sk, the first electrode of the seventh thin-film transistor ST7 is connected to the first electrode of the light-emitting element LEL, and the second electrode of the seventh thin-film transistor ST7 is connected to the initialization voltage line VIL.

The capacitor Cap is formed between the first gate electrode of the first thin-film transistor ST1 and the first supply voltage line VDDL. One electrode of the capacitor Cap is connected to the first gate electrode of the first thin-film transistor ST1, while the other electrode thereof is connected to the first supply voltage line VDDL.

When the first electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 is a source electrode, the second electrode thereof is a drain electrode. Alternatively, when the first electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 is a drain electrode, the second electrode thereof is a source electrode.

Each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 includes the semiconductor layer as described above. Each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 includes, but are not limited to, a semiconductor pattern layer made of polycrystalline silicon.

When each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 is made of polycrystalline silicon, the process of forming it is a low-temperature polycrystalline silicon process. In addition, although each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 is a p-type thin film transistor in the example shown in FIG. 3, embodiments of the disclosure are not limited thereto. In an embodiment, some or all of the thin-film transistors are n-type thin film transistors.

In the following description, a stack structure of the display panel PNL in the display area DA will be described in detail.

Referring to FIG. 4, in an embodiment, the display panel PNL includes a sub-pixel SP, a thin-film encapsulation layer 2000, a touch layer 3000, etc. in the display area DA.

The sub-pixel SP includes a substrate 1100, a buffer layer 1200, a semiconductor layer ACTL, a first gate insulating layer 1300, a first conductive layer CDL1, a second gate insulating layer 1400, a second conductive layer CDL2, a first interlayer dielectric layer 1500, a third conductive layer CDL3, a first via insulating layer 1600, a fourth conductive layer CDL4, a second via insulating layer 1700, and a light-emitting element LEL.

The substrate 1100 is a base of the display panel PNL. If the substrate 1100 is a flexible substrate, the substrate 1100 includes, but is not limited to, polyimide. If the substrate 1100 is a rigid substrate, the substrate 1100 includes, but is not limited to, glass.

The buffer layer 1200 prevents diffusion of metal atoms or impurities from the substrate 1100 into the semiconductor layer ACTL. The buffer layer 1200 is disposed on the entire substrate 1100.

The semiconductor layer ACTL is disposed on the buffer layer 1200 in the display area DA, receives signals from the scan lines and the data lines and transmits these signals to the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7. In the following description, the first electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 is the source electrode, the second electrode thereof is the drain electrode.

The semiconductor layer ACTL includes a semiconductor pattern layer of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7. For example, as shown in FIG. 4, the first thin-film transistor ST1 includes a first semiconductor pattern layer ACT1, and the fifth transistor includes a fifth semiconductor pattern layer ACT5.

The first semiconductor pattern layer ACT1 includes a first channel region that overlaps a first gate electrode G1 to be described below, a first drain region located at one side of the first channel region, and a first source region located on the opposite side of the first channel region. The fifth semiconductor pattern layer ACT5 includes a fifth channel region that overlaps a fifth gate electrode G5 to be described below, a fifth drain region located on one side of the fifth channel region, and a fifth source region located on the opposite side of the fifth channel region.

The semiconductor layer ACTL is disposed directly on one surface of the buffer layer 1200. For example, the semiconductor layer ACTL is in direct contact with the surface of the buffer layer 1200. The semiconductor layer ACTL is selectively patterned and disposed on the buffer layer 1200. In some embodiments, the semiconductor layer ACTL includes, but is not limited to, polycrystalline silicon. For example, the semiconductor layer ACTL may further include amorphous silicon or an oxide semiconductor.

The first gate insulating layer 1300 insulates the semiconductor layer ACTL from the first conductive layer CDL1 to be described below. The first gate insulating layer 1300 is disposed on the buffer layer 1200 and covers the semiconductor layer ACTL. The first gate insulating layer 1300 conformally covers the semiconductor layer ACTL. In some embodiments, the first gate insulating layer 1300 includes an inorganic insulating material.

The first conductive layer CDL1 is disposed on the first gate insulating layer 1300. The first conductive layer CDL1 is disposed directly on one surface of the first gate insulating layer 1300. For example, the first conductive layer CDL1 is in direct contact with the surface of the first gate insulating layer 1300.

The first conductive layer CDL1 includes the gate electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 in the display area DA. For example, the first conductive layer CDL1 includes the first gate electrode G1 of the first thin-film transistor ST1 and the fifth gate electrode G5 of the fifth thin-film transistor ST5 as shown in FIG. 4. As described above, the first gate electrode G1 and the fifth gate electrode G5 overlap in the third direction DR3 the first channel region of the first semiconductor pattern layer ACT1, and the fifth channel region of the fifth semiconductor pattern layer ACT5, respectively.

The first conductive layer CDL1 includes a metal. For example, the first conductive layer CDL1 includes at least one of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) or copper (Cu).

The second gate insulating layer 1400 insulates the first conductive layer CDL1 from the second conductive layer CDL2 to be described below. The second gate insulating layer 1400 is disposed on the first gate insulating layer 1300 and covers the first conductive layer CDL1. The second gate insulating layer 1400 conformally covers the first conductive layer CDL1 and has substantially the same thickness on the first gate insulating layer 1300 and the first conductive layer CDL1. In some embodiments, the second gate insulating layer 1400 includes an inorganic insulating material and includes multiple layers.

The second conductive layer CDL2 is disposed on the second gate insulating layer 1400. The second conductive layer CDL2 is disposed directly on one surface of the second gate insulating layer 1400. For example, the second conductive layer CDL2 is in direct contact with the surface of the second gate insulating layer 1400.

The second conductive layer CDL2 includes a capacitor electrode disposed in the display area DA. For example, as shown in FIG. 4, the second conductive layer CDL2 includes a first capacitor electrode CAP1 of the first thin-film transistor ST1. The same voltage applied to the first supply voltage line VDDL is applied to the first capacitor electrode CAP1. The first capacitor electrode CAP1 forms a capacitor together with the first gate electrode G1 and the second gate insulating layer 1400. The first capacitor electrode CAP1 overlaps the first gate electrode G1 in the third direction DR3.

The second conductive layer CDL2 includes a metal. For example, the second conductive layer CDL2 includes at least one of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) or copper (Cu).

The first interlayer dielectric layer 1500 insulates the second conductive layer CDL2 from the third conductive layer CDL3 to be described below. The first interlayer dielectric layer 1500 is disposed on the second gate insulating layer 1400 and covers the second conductive layer CDL2. The first interlayer dielectric layer 1500 may include an inorganic insulating material or an organic insulating material. The first interlayer dielectric layer 1500 has a single layer. However, embodiments of the disclosure are not limited thereto. In some embodiments, the first interlayer dielectric layer 1500 includes multiple layers.

The third conductive layer CDL3 is disposed on the first interlayer dielectric layer 1500. The third conductive layer CDL3 includes the source electrode and the drain electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7. For example, the third conductive layer CDL3 includes a fifth source electrode S5 and a fifth drain electrode D5 of the fifth transistor as shown in FIG. 4.

When the third conductive layer CDL3 is disposed so that the source electrode and the drain electrode are formed on the first interlayer dielectric layer 1500, the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 are completed. The fifth source electrode S5 and the fifth drain electrode D5 penetrate the first interlayer dielectric layer 1500, the second gate insulating layer 1400, and the first gate insulating layer 1300 and are electrically connected to the fifth source/drain regions of the fifth semiconductor pattern, respectively.

The third conductive layer CDL3 includes a metal. For example, the third conductive layer CDL3 includes at least one of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) or copper (Cu). In some embodiments, the third conductive layer CDL3 has a multilayer structure. For example, the third conductive layer CDL3 may have a two-layer structure of Ti/Al or a three-layer structure of Ti/Al/Ti.

The via insulating layer includes a first via insulating layer 1600 and a second via insulating layer 1700.

The first via insulating layer 1600 partially insulates the third conductive layer CDL3 from the fourth conductive layer CDL4 to be described below. In the display area DA, the first via insulating layer 1600 is disposed on the first interlayer dielectric layer 1500 and covers the third conductive layer CDL3. The first via insulating layer 1600 is formed using an organic insulating material such as an acrylic resin, a polyimide-based resin, or a polyamide-based resin.

The fourth conductive layer CDL4 is disposed on the first via insulating layer 1600. The fourth conductive layer CDL4 includes an connection electrode, an initialization voltage line, etc., that are electrically connected to the source electrode or the drain electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7. For example, the fourth conductive layer CDL4 includes a fifth connection electrode CNE5 that is electrically connected to the fifth drain electrode D5 as shown in FIG. 4. The fifth connection electrode CNE5 is electrically connected to the fifth drain electrode D5 through a contact hole that penetrates the first via insulating layer 1600.

The fourth conductive layer CDL4 includes a metal. For example, the fourth conductive layer CDL4 includes at least one of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) or copper (Cu). In some embodiments, the fourth conductive layer CDL4 has a multilayer structure. For example, the fourth conductive layer CDL4 may have a two-layer structure of Ti/Al or a three-layer structure of Ti/Al/Ti.

The second via insulating layer 1700 is disposed on the first via insulating layer 1600 in the display area DA and covers the fourth conductive layer CDL4. Like the first via insulating layer 1600, the second via insulating layer 1700 is formed using an organic insulating material such as an acrylic resin, a polyimide-based resin, or a polyamide-based resin. One surface of the second via insulating layer 1700 in the third direction DR3 is an upper surface on which a first electrode 1910 of the light-emitting element LEL is disposed, and the opposite surface thereof in the third direction DR3 is a lower surface on which the first via insulating layer 1600 is disposed.

As described above, the light-emitting element LEL includes the first electrode 1910, the emissive layer 1930 and a second electrode 1950, and is disposed on the second via insulating layer 1700.

The first electrode 1910 of the light-emitting element LEL is an anode electrode, and as shown in FIG. 4, is electrically connected to the fifth connection electrode CNE5 through a contact hole that penetrates the second via insulating layer 1700, and is electrically connected to the fifth drain electrode D5 of the fifth thin-film transistor ST5. One surface of the first electrode 1910 in the third direction DR3 is an upper surface on which the emissive layer 1930 is disposed, and the opposite surface thereof in the third direction DR3 is a lower surface on which the second via insulating layer 1700 is disposed.

A pixel-defining layer 1800 is disposed on the second via insulating layer 1700 on which the first electrode 1910 is disposed, and on a part of the first electrode 1910. The pixel-defining layer 1800 is formed using an organic material, etc. The pixel-defining layer 1800 includes an opening that partially exposes the first electrode 1910. A swelling prevention layer 1920 is disposed between the pixel-defining layer 1800 and the first electrode 1910. The first electrode 1910, the pixel-defining layer 1800 and the swelling prevention layer 1920 will be described in detail below.

The emissive layer 1930 is disposed on the first electrode 1910 and the pixel-defining layer 1800. The emissive layer 1930 is disposed on the the upper surface of the first electrode 1910 exposed by the pixel-defining layer 1800. If the emissive layer 1930 is an organic emissive layer that includes an organic material, the light-emitting element LEL is an organic light-emitting diode. If the emissive layer 1930 includes a quantum-dot emissive layer, the light-emitting element LEL is a quantum-dot light emitting device. If the emissive layer 1930 includes an inorganic semiconductor, the light-emitting element LEL is an inorganic light-emitting device. Alternatively, the light-emitting element EL is a micro light-emitting diode.

The second electrode 1950 is disposed on the emissive layer 1930. The second electrode is a cathode electrode.

The thin-film encapsulation layer 2000 prevents external moisture and oxygen from permeating into the light-emitting element LEL. The thin-film encapsulation layer 2000 is disposed on the second electrode 1950 of the light-emitting element LEL.

The thin-film encapsulation layer 2000 includes at least one organic layer 2300 and at least one inorganic layer in the display area DA. The at least one organic layer 2300 and the at least one inorganic layer are alternately stacked on each other. For example, as shown in FIG. 4, the thin-film encapsulation layer 2000 includes a first inorganic layer 2100, an organic layer 2300 and a second inorganic layer 2500, and the organic layer 2300 is disposed between the first inorganic layer 2100 and the second inorganic layer 2500. However, embodiments of the disclosure are not limited thereto.

The touch layer 3000 senses a touch input applied to the display device 1. The touch layer 3000 is disposed on the thin-film encapsulation layer 2000. The touch layer 3000 includes a touch protection layer and one or more conductive layers and insulating layers. The conductive layers and insulating layers are alternately stacked on each other. The touch protection layer is an organic film. In some embodiments, the touch layer 3000 is omitted.

Hereinafter, the swelling prevention layer 1920, the first electrode 1910 of the light-emitting element LEL, and the pixel-defining layer 1800 will be described in detail with reference to FIG. 5. For convenience of illustration, elements other than the second via insulating layer 1700, the first electrode 1910, the swelling prevention layer 1920 and the pixel-defining layer 1800 are not depicted in FIG. 5.

Referring to FIG. 5, in an embodiment, the first electrode 1910 of the light-emitting element LEL includes a first layer 1910_a, a second layer 1910_b disposed on the first layer 1910_a, and a third electrode 1910 disposed on the second layer 1910_b. The swelling prevention layer 1920 may be disposed between the pixel-defining layer 1800 and the first electrode 1910.

The first layer 1910_a of the first electrode 1910 is disposed on the upper surface of the second via insulating layer 1700, and is electrically connected to the fifth connection electrode CNE5 through a contact hole that penetrates the second via insulating layer 1700. One surface of the first layer 1910_a in the third direction DR3 is an upper surface on which the second layer 1910_b is disposed, and the opposite surface thereof in the third direction DR3 is a lower surface on which the second via insulating layer 1700 is disposed.

The first electrode 1910 includes a transparent conductive oxide. The transparent conductive oxide includes at least one of indium tin oxide (ITO), poly indium tin oxide ((poly)-ITO), indium zinc oxide (IZO), indium gallium zinc oxide (IGZO), or indium tin zinc oxide (ITZO). In some embodiments, the first layer 1910_a includes, but is not limited to, indium tin oxide. In the following description, it is assumed that the first layer 1910_a includes indium tin oxide for convenience of illustration.

The second layer 1910_b reflects light generated from the emissive layer 1930. The second layer 1910_b is disposed on the first layer 1910_a. The second layer 1910_b has a substantially uniform thickness on the first layer 1910_a. One surface of the second layer 1910_b in the third direction DR3 is an upper surface on which the third layer 1910_c is disposed, and the opposite surface thereof in the third direction DR3 is a lower surface on which the first layer 1910_a is disposed.

The second layer 1910_b includes a reflective metal. The reflective metal includes at least one of silver (Ag), molybdenum (Mo), copper (Cu), gold (Au), or aluminum (Al). In some embodiments, the second layer 1910_b includes, but is not limited to, silver. In the following description, it is assumed that the second layer 1910_b includes silver for convenience of illustration.

The third layer 1910_c transmits light generated in the emissive layer 1930. The third layer 1910_c is disposed on the second layer 1910_b. The third layer 1910_c has a substantially uniform thickness on the second layer 1910_b. One surface of the third layer 1910_c in the third direction DR3 is an upper surface on which the emissive layer 1930 is disposed, and the opposite surface thereof in the third direction DR3 is a lower surface on which the second layer 1910_b is disposed.

The third layer 1910_c includes a transparent conductive oxide, like the first layer 1910_a. The transparent conductive oxide includes at least one of indium tin oxide (ITO), poly indium tin oxide ((poly)-ITO), indium zinc oxide (IZO), indium gallium zinc oxide (IGZO), or indium tin zinc oxide (ITZO). In some embodiments, the third layer 1910_c includes, but is not limited to, indium tin oxide. In the following description, it is assumed that the third layer 1910_c includes indium tin oxide for convenience of illustration.

As described above, the first electrode 1910 has, but is not limited to, a multilayer structure of ITO/Ag/ITO. The upper surface of the first electrode 1910 is substantially identical to the upper surface of the third layer 1910_c. The lower surface of the first electrode 1910 is substantially identical to the lower surface of the first layer 1910_a.

The pixel-defining layer 1800 includes an opening OA that exposes a part of the upper surface of the first electrode 1910. The part of the first electrode 1910 that does not overlap the pixel-defining layer 1800 in the third direction DR3 is in the opening OA. The pixel-defining layer 1800 further includes a light-absorbing material and an organic material. The light-absorbing material absorbs light in the visible wavelength range. In some embodiments, the light-absorbing material includes, but is not limited to, a lactam black pigment. In some embodiments, the organic material includes, but is not limited to, amorphous nitrogenated carbon, polyacrylate-based resin, or a polyimide-based resin, etc.

The pixel-defining layer 1800 includes overlapping regions 1810 that extend in the second direction DR2 and overlap in the third direction DR3 with a part of both sides of the first electrode 1910. The overlapping regions 1810 include a first region 1810_a that overlaps in the third direction DR3 with the swelling prevention layer 1920 to be described below, and a second region 1810_b that does not overlap the swelling prevention layer 1920 in the third direction DR3. For example, the first region 1810_a overlaps the first electrode 1910 and the swelling prevention layer 1920 in the third direction DR3, and the second region 1810_b overlaps the first electrode 1910 in the third direction DR3 but not the swelling prevention layer 1920.

The second region 1810_b of the pixel-defining layer 1800 is in direct contact with the upper surface of the first electrode 1910, i.e., the upper surface of the third layer 1910_c. The side profile of the pixel-defining layer 1800 at the opening OA has a slope that results from a reflow process of fabricating the display device, which will be described below. In some embodiments, the side profile of the pixel-defining layer 1800 have a shape in which the slope of a line tangent to the upper surface of the pixel-defining layer 1800, hereinafter referred to as a tangent line, gradually increases toward the end in contact with the first electrode 1910, but embodiments of the disclosure are not limited thereto. In the following description, it is assumed that the side profile of the pixel-defining layer 1800 has a shape in which the slope of the tangent line on the side increases toward the end in contact with the first electrode 1910, for convenience of illustration. The side profile of the pixel-defining layer 1800 is substantially similar to that of the structure of FIG. 19, which will be described below. An angle θ is formed between the upper surface of the first electrode 1910 and the tangent line, and at the point where the upper surface of the second region 1810_b makes direct contact with the upper surface of the first electrode 1910, the angle θ is greater than 0° and equal to or less than 10°. For example, the angle θ is greatest at the point where the upper surface of the second region 1810_b makes direct contact with the upper surface of the first electrode 1910, and the angle θ decreases away from contact point with the first electrode 1910. However, embodiments of the disclosure are not limited thereto.

Figure 8:
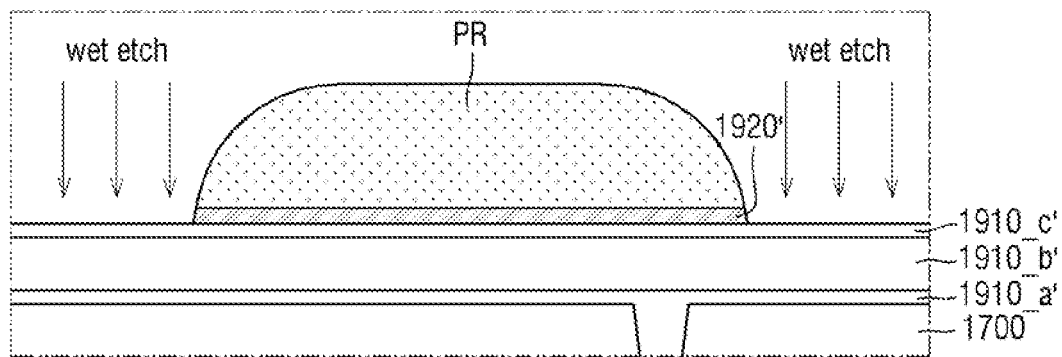

The swelling prevention layer 1920 is a residue that remains after a swelling prevention material layer 1920', shown in FIG. 8, has been etched during a process of fabricating the display device, which will be described below. The swelling prevention material layer 1920' prevents swelling of the second layer 1910_b that can occur during a process of disposing the pixel-defining layer 1800. If the first electrode 1910 is wet-etched without the swelling prevention material layer 1920' being disposed on the upper surface of the third layer 1910_c of the first electrode 1910, fine pin holes, shown in FIG. 27, that penetrate through the third layer 1910_c in the third direction DR3 can form in the third layer 1910_c of the first electrode 1910. If the pixel-defining layer 1800 is disposed on the third layer 1910_c with the pin holes formed therein, the second layer 1910_b can swell through the pin holes in the third direction DR3 and damage the emissive layer 1930. As a result, dark spots can form in the display area DA, which can reduce the emission efficiency of the light-emitting element LEL. Accordingly, by forming the swelling prevention material layer 1920' on the third layer 1910_c before etching the first electrode 1910, the pin holes can be prevented. In this manner, swelling of the second layer 1910_b can be prevented to ensure the emission efficiency of the light-emitting element LEL.

The swelling prevention layer 1920 is a residue that remains after the swelling prevention material layer 1920' has been etched in a process of fabricating the display device, and is disposed at both ends of the upper surface of the third layer 1910_c in the second direction DR2. The swelling prevention layer 1920 is disposed inside the pixel-defining layer 1800 and is covered by the pixel-defining layer 1800. For example, both ends of the swelling prevention layer 1920 are surrounded by the pixel-defining layer 1800, as shown in FIG. 5. The swelling prevention layer 1920 is completely covered by the pixel-defining layer 1800. The swelling prevention layer 1920 overlaps the first region 1810_a of the pixel-defining layer 1800 and the first electrode 1910 in the third direction DR3, but does not overlap with the second region 1810_b of the pixel-defining layer in the third direction DR3.

The swelling prevention layer 1920 includes a material that differs from that of the first layer 1910_a and the third layer 1910_c of the first electrode 1910. Accordingly, when the first electrode 1910 is etched during a process of fabricating the display device to be described below, the etchant for the first electrode 1910 differs from that of the swelling prevention layer 1920. In some embodiments, the swelling prevention layer 1920 includes, but is not limited to, indium zinc oxide (IZO) or indium gallium zinc oxide (IGZO), etc. In the following description, it is assumed that the swelling prevention layer 1920 includes indium gallium zinc oxide for convenience of illustration.

In some embodiments, both ends of the first layer 1910_a of the first electrode 1910 in the second direction DR2, both ends of the second layer 1910_b in the second direction DR2, and both ends of the third layer 1910_c in the second direction DR2 are all aligned with each other. However, embodiments of the disclosure are not limited thereto.

The ends of the first electrode 1910 in the second direction DR2 are aligned with the ends of the swelling prevention layer 1920 in the second direction DR2. For example, in some embodiments, one end of the first electrode 1910 in the second direction DR2 is aligned with one end of the corresponding swelling prevention layer 1920 disposed thereon in the second direction DR2. The opposite end of the first electrode 1910 in the second direction DR2 is aligned with the opposite end of the corresponding swelling prevention layer 1920 disposed thereon. However, embodiments of the disclosure are not limited thereto.

Hereinafter, a method of fabricating a display device 1 according to an embodiment of the disclosure will be described. A process of forming the substrate 1100, the buffer layer 1200, the semiconductor layer ACTL, the first gate insulating layer 1300, the first conductive layer CDL1, the second gate insulating layer 1400, the second conductive layer CDL2, the first interlayer dielectric layer 1500, the third conductive layer CDL3, the first via insulating layer 1600, the fourth conductive layer CDL4 and the second via insulating layer 1700 shown in FIG. 4 is well known in the art; and, therefore, a description thereof will be omitted.

FIGS. 6 to 13 are cross-sectional views illustrating processing steps of fabricating the display device shown in FIG. 5.

Figure 6:
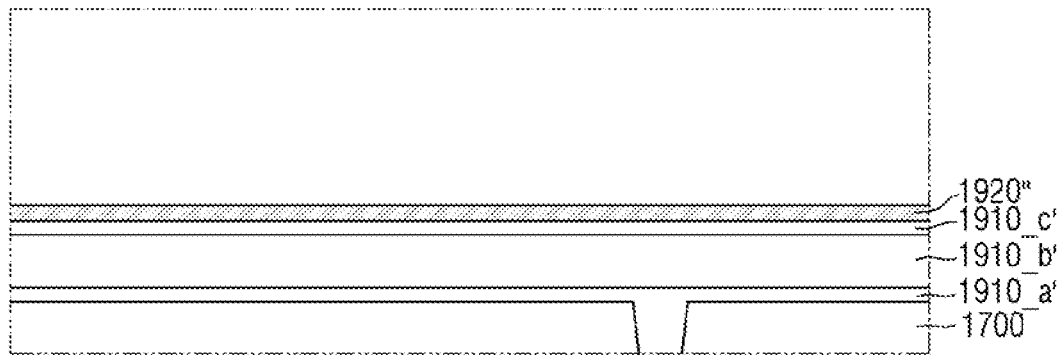
FIGS. 6 to 13 are cross-sectional views that illustrate processing steps of fabricating a display device shown in FIG. 5.
Figure 6:
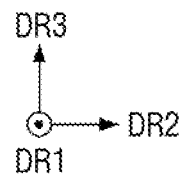

Referring to FIG. 6, in an embodiment, a substrate 1100 on which a second via insulating layer 1700 is disposed is prepared, and a first material layer 1910_a', a second material layer 1910_b', a third material layer 1910_c', and a fourth material layer 1920" are sequentially formed on the second via insulating layer 1700. In some embodiments, the first material layer 1910_a' includes indium tin oxide, the second material layer 1910_b' includes silver (Ag), the third material layer 1910_c' includes indium tin oxide, and the fourth material layer 1920" includes indium gallium zinc oxide. However, embodiments of the disclosure are not limited thereto. According to embodiments of the disclosure, the first material layer 1910_a' and the third material layer 1910_c' include various transparent conductive oxides as described above, and the second material layer 1910_b' includes an above-described reflective metal.

The first material layer 1910_a' includes substantially the same material as the first layer 1910_a, the second material layer 1910_b' includes substantially the same material as the second layer 1910_b, the third material layer 1910_c' includes substantially the same material as the third layer 1910_c, and the fourth material layer 1920" includes substantially the same material as the swelling prevention material layer 1920' and the swelling prevention layer 1920.

Figure 7:
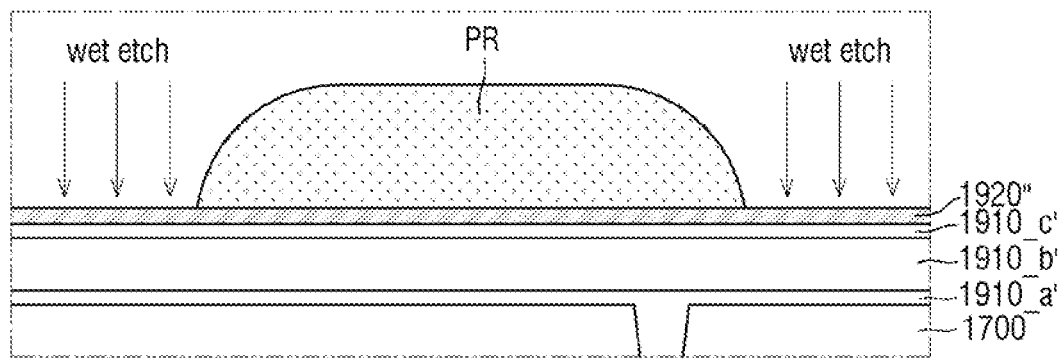

Subsequently, referring to FIG. 7, a photoresist pattern PR is formed on part of the fourth material layer 1920", and both ends of the fourth material layer 1920" in the second direction DR2 that are not covered by the photoresist pattern PR are patterned using the photoresist pattern PR as an etch stop layer to form the swelling prevention material layer 1920'. For example, a photosensitive organic material is disposed on the fourth material layer 1920", and is exposed to light and developed to form the photoresist pattern PR on the fourth material layer 1920". Then, the ends of the fourth material layer 1920" in the second direction DR2 that are not covered by the photoresist pattern PR are patterned via a wet etch process. In doing so, the etchant used for patterning the ends of the fourth material layer 1920" in the second direction DR2 differs from the etchant used for patterning the ends of the first material layer 1910_a', the second material layer 1910_b' and the third material layer 1910_c' in the second direction DR2.

Figure 9:
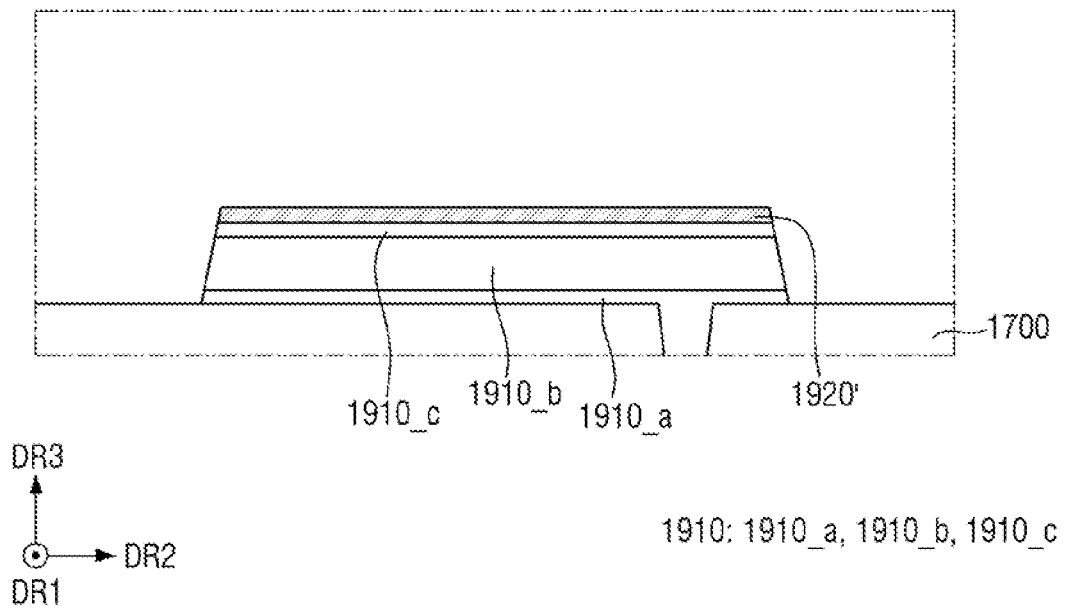

Subsequently, in an embodiment, referring to FIGS. 8 and 9, the ends of the first material layer 1910_a', the second material layer 1910_b' and the third material layer 1910_c' in the second direction DR2 are patterned using the photoresist pattern PR on the swelling prevention material layer 1920' as an etch stop layer, so that the first layer 1910_a, the second layer 1910_b and the third layer 1910_c are formed. In this manner, the first electrode 1910, which includes the first layer 1910_a, the second layer 1910_b and the third layer 1910_c, is formed. For example, as described above, the etchant used to etch the fourth material layer 1920" differs from the etchant used to pattern the ends of the first material layer 1910_a', the second material layer 1910_b' and the third material layer 1910_c' in the second direction DR2, and the fourth material layer 1920" and the swelling prevention material layer 1920' contain substantially the same material. Therefore, by patterning the ends of the first material layer 1910_a', the second material layer 1910_b and the third material layer 1910_c' in the second direction DR2 with an etchant that differs from the etchant used to etch the fourth material layer 1920", the swelling prevention layer 1920' is not etched. Subsequently, a process of removing the photoresist pattern layer PR is performed.

The swelling prevention layer 1920' is disposed on the upper surface of the third layer 1910_c. The ends of the swelling prevention layer 1920' in the second direction DR2 are aligned with the ends of the first electrode 1910 in the second direction DR2, but embodiments of the disclosure are not limited thereto.

If a photoresist pattern layer PR is formed on the third layer 1910_c and the first material layer 1910_a', the second material layer 1910_b' and the third material layer 1910_c' are patterned via a wet etching process without the swelling prevention material layer 1920', the etchant used in the wet etching process can permeate into an interface between the photoresist pattern layer PR and the third layer 1910_c. When this happens, the etchant can reach a part of the third layer 1910_c that overlaps the photoresist pattern layer PR in the third direction DR3 and damage the third layer 1910_c. For example, the etchant reaches the third layer 1910_c and forms pin holes, shown in FIG. 27, that penetrate the third layer 1910_c. The pin holes cause a part of the second layer 1910_b to swell during a process of disposing the pixel-defining layer 1800, to be described below. For this reason, by disposing the swelling prevention material layer 1920' and forming the photoresist pattern layer PR to prevent the etchant used to etch the first electrode 1910 from reaching the third layer 1910_c, the pin holes can be prevented.

Figure 10:
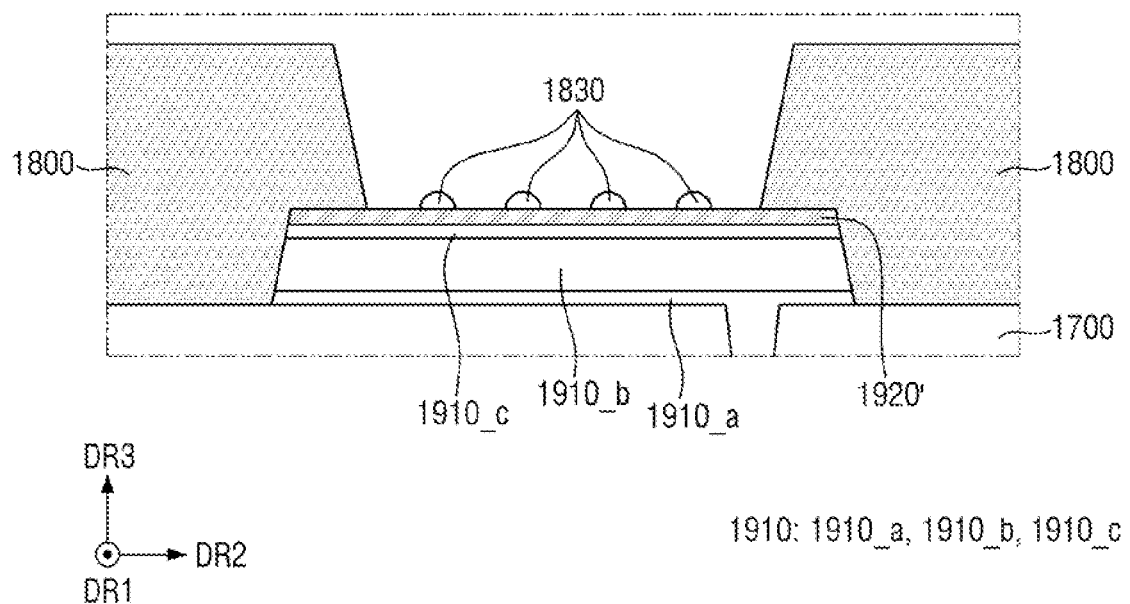

Subsequently, referring to FIG. 10, in an embodiment, a pixel-defining layer 1800 that exposes a part of the upper surface of the swelling prevention material layer 1920' is formed on the second via insulating layer 1700, the first electrode 1910 and the swelling prevention material layer 1920'. The pixel-defining layer 1800 includes a photosensitive organic material. The photosensitive organic material is disposed on the entire first electrode 1910 and the swelling prevention layer 1920, is exposed to light and developed and patterned so that a part of the upper surface of the swelling prevention layer 1920 is exposed, to form the pixel-defining layer 1800.

During a process of exposing, developing and patterning the photosensitive organic material, a part of the photosensitive organic material may remain on the upper surface of the swelling prevention material layer 1920' to create organic residues 1830. The organic residues 1830 are located on the upper surface of the swelling prevention material layer 1920' exposed by the pixel-defining layer 1800. In particular, when the organic material that forms the pixel-defining layer 1800 contains a light-blocking material, the organic residues 1830 are more likely to remain. The organic residues 1830 can lower the emission efficiency of the light-emitting element LEL, and thus are removed.

Figure 11:
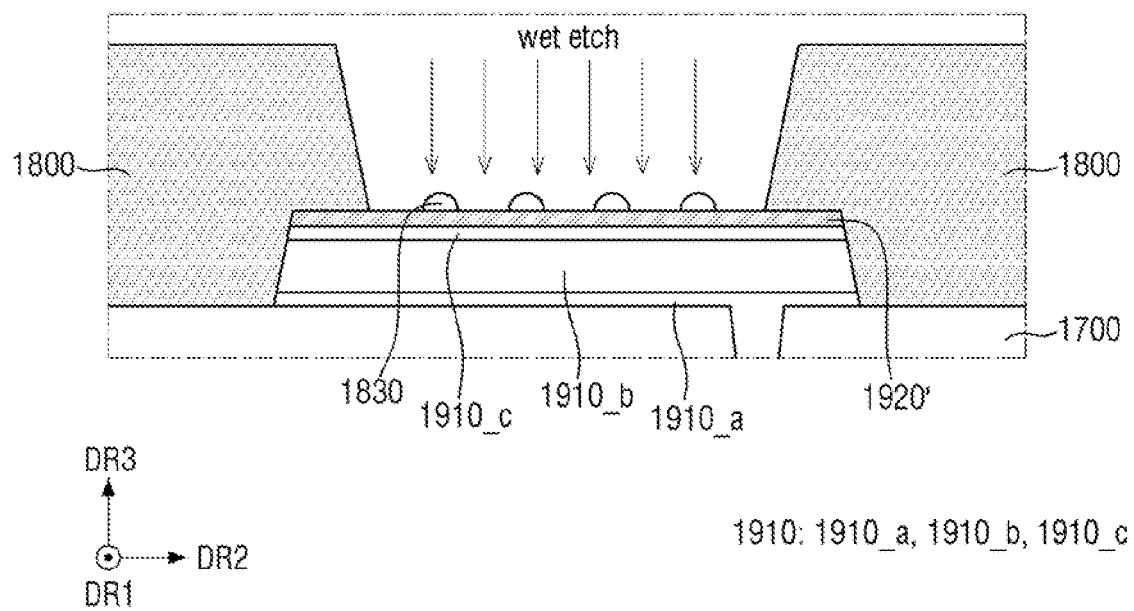
Figure 12:
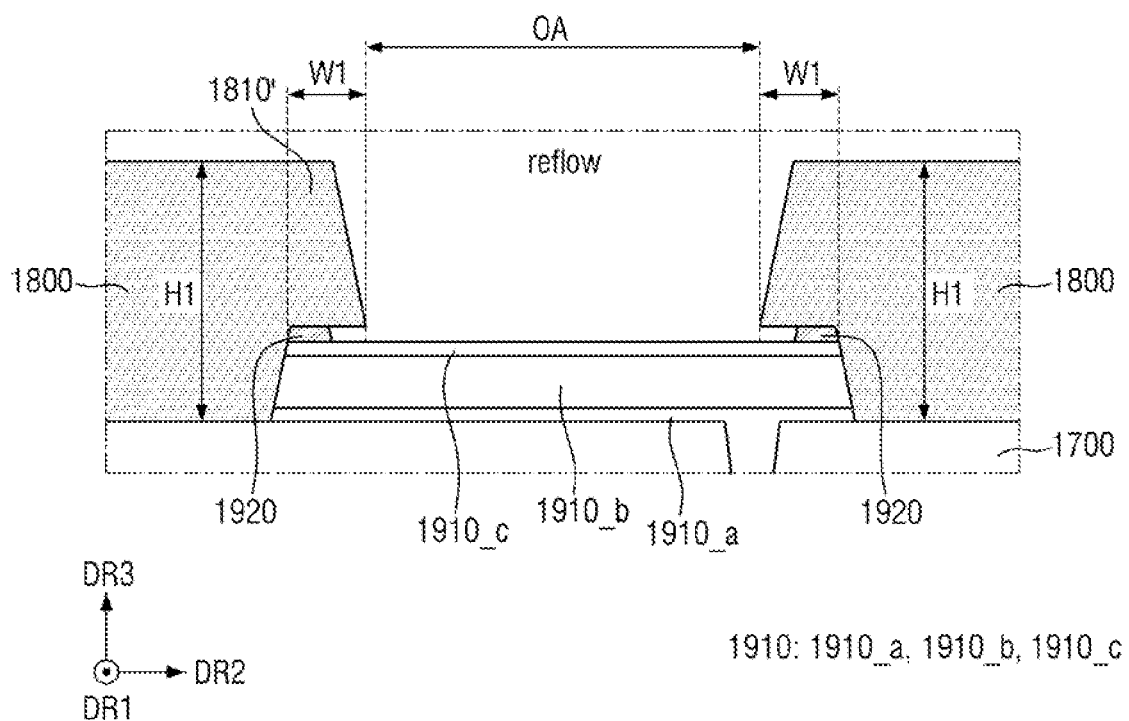
Figure 13:
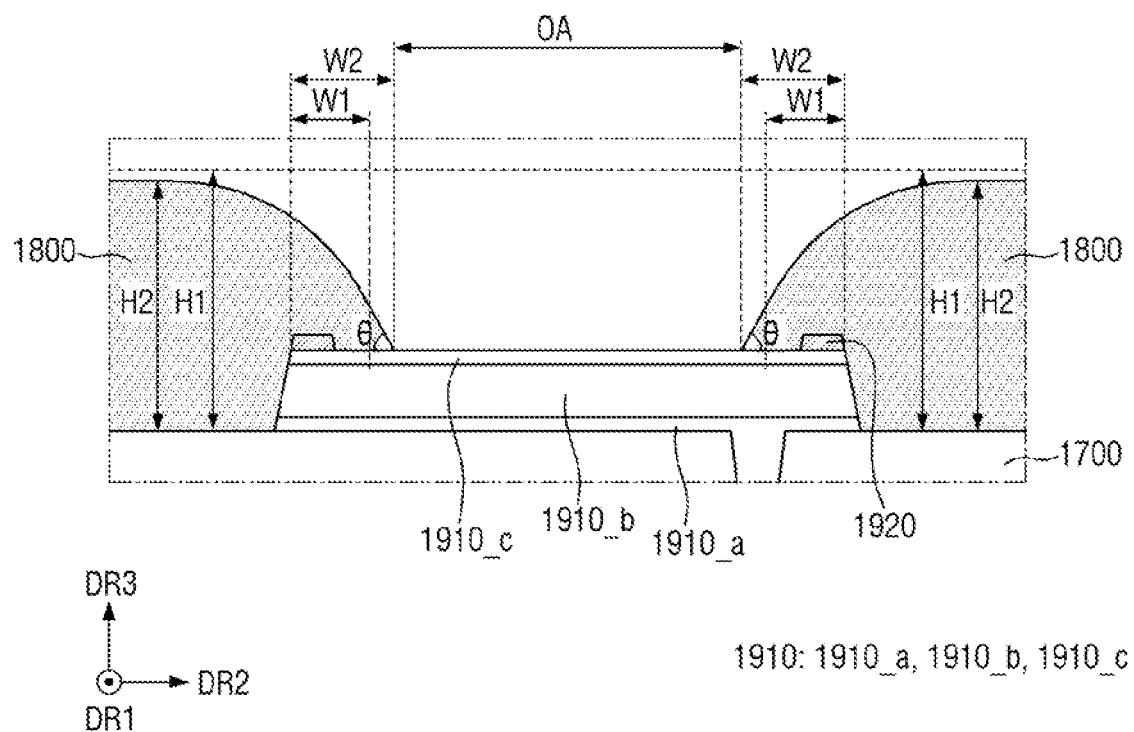

Subsequently, referring to FIGS. 11 to 13, in an embodiment, the swelling prevention material layer 1920' exposed by the pixel-defining layer 1800 is etched, and a reflow process is performed by applying heat to the pixel-defining layer 1800. For example, the swelling prevention material layer 1920' is etched by wet etching, and the reflow process may be performed at a temperature higher than 250° C.

When the swelling prevention material layer 1920' is etched by wet etching, the organic residues 1830 that remain on the upper surface of the swelling prevention material layer 1920' exposed by the pixel-defining layer 1800 are removed when the swelling prevention layer material layer 1920' is etched. Accordingly, an empty space is formed between the pixel-defining layer 1800 and the first electrode 1910. On the other hand, the ends of the swelling prevention material layer 1920' in the second direction DR2 that are covered by the pixel-defining layer 1800 remain without being completely removed by the etching process. For example, the remaining portions of swelling prevention material layer 1920' are located in the empty space between the pixel-defining layer 1800 and the first electrode 1910 and form the swelling prevention layer 1920.

The pixel-defining layer 1800 includes an undercut region 1810' that overlaps the first electrode 1910 in the third direction DR3 and extends in the second direction DR2 into the pixel-defining layer 1800 from the opening OA. The maximum width W1 of the undercut region 1810' in the second direction DR2 may vary depending on the process.

After etching the swelling prevention material layer 1920' exposed by the pixel-defining layer 1800, a reflow process is performed. A part of the pixel-defining layer 1800 reflows due to the reflow process, and thus the empty space between the pixel-defining layer 1800 and the first electrode 1910 is filled with the pixel-defining layer 1800. Accordingly, the undercut region 1810' is converted into the overlapping region 1810, and the pixel-defining layer 1800 is in direct contact with the upper surface of the first electrode 1910. The swelling prevention layer 1920 that remains on the upper surface of the third layer 1910_c is surrounded by the pixel-defining layer 1800. The width W2 of the overlapping region 1810 in contact with the upper surface of the third layer 1910_c of the first electrode 1910 in the second direction DR2 is greater than the maximum width W1 of the undercut region 1810' in the second direction DR2.

As described above, the side profile of the pixel-defining layer 1800 is formed to have a slope that curves down to the upper surface of the third layer 1910_c as a result of a reflow process of fabricating a display device, which will be described below. The angle θ between the tangent line at the point of contact of the upper surface of the third layer 1910_c and the upper surface of the first electrode 1910 is greater than 0° and equal to or less than 10°.

Once the reflow process is performed, the thickness of the pixel-defining layer 1800 in the third direction DR3, hereinafter referred to as a thickness, changes. For example, a maximum thickness of the pixel-defining layer 1800 changes from a thickness H1 before the reflow process to a thickness H2 after the reflow process. The thickness H1 before the reflow process is greater than the thickness H2 after the reflow process. For example, the thickness of the pixel-defining layer 1800 is reduced by the reflow process.

The emissive layer 1930 is formed on the pixel-defining layer 1800 and the upper surface of the first electrode 1910 exposed by the pixel-defining layer 1800 after the reflow process, and a second electrode 1950 is formed on the emissive layer 1930, to form a sub-pixel SP. As a result, the structure of the sub-pixel SP as shown in FIG. 4 can be formed.

Hereinafter, a display device 1 according to embodiments of the disclosure will be described. In the following description, the same or similar elements may be denoted by the same or similar reference numerals, and redundant descriptions will be summarized or omitted.

Figure 14:
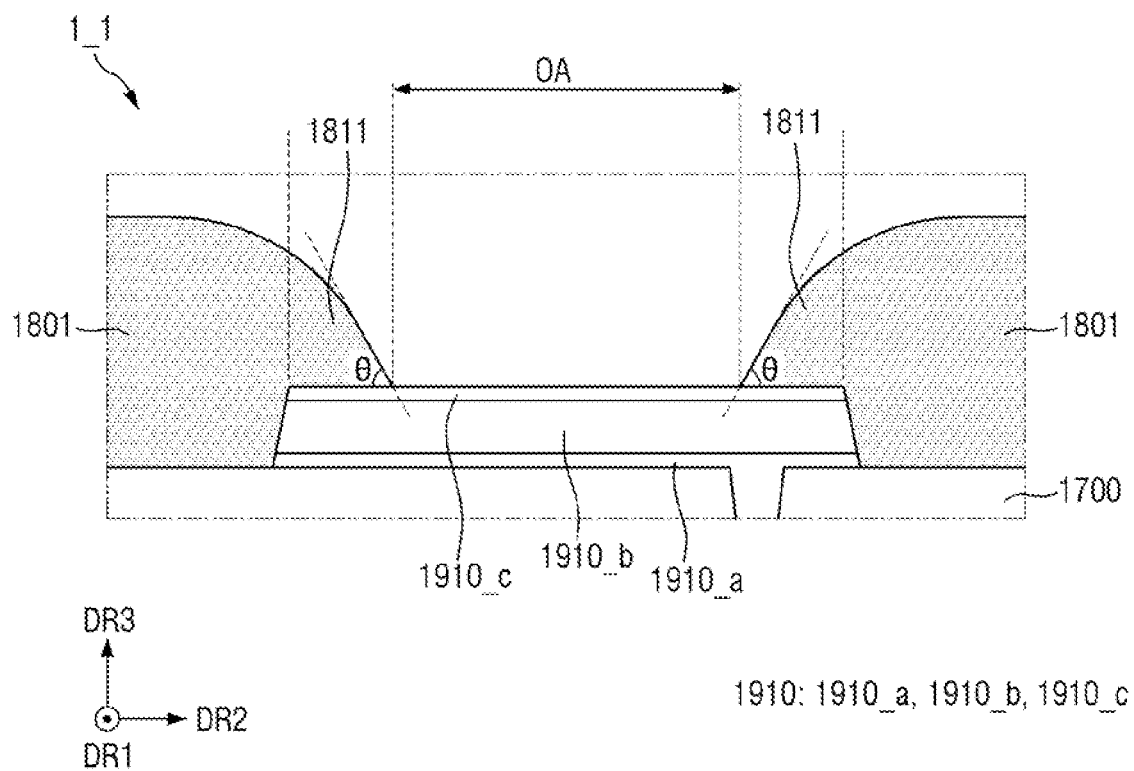
FIG. 14 is a cross-sectional view of a first electrode and a pixel-defining layer of a display device according to an embodiment.

FIG. 14 is a cross-sectional view of a first electrode and a pixel-defining layer of a display device according to an embodiment.

In an embodiment shown in FIG. 14, the entire overlapping region 1811 of a pixel-defining layer 1801 of a display device 1_1 is in direct contact with the upper surface of the first electrode 1910. Specifically, no swelling prevention layer 1920 is disposed between the pixel-defining layer 1801 and the first electrode 1910. This results from the swelling prevention material layer 1920' being completely etched during the etching process.

Hereinafter, a method of fabricating the display device 1_1 of FIG. 14 will be described. The processing steps before disposing the pixel-defining layer 1801 are substantially identical to those of the method of fabricating the display device 1 according to the above-described embodiment; and, therefore, the redundant descriptions will be omitted.

Figure 15:
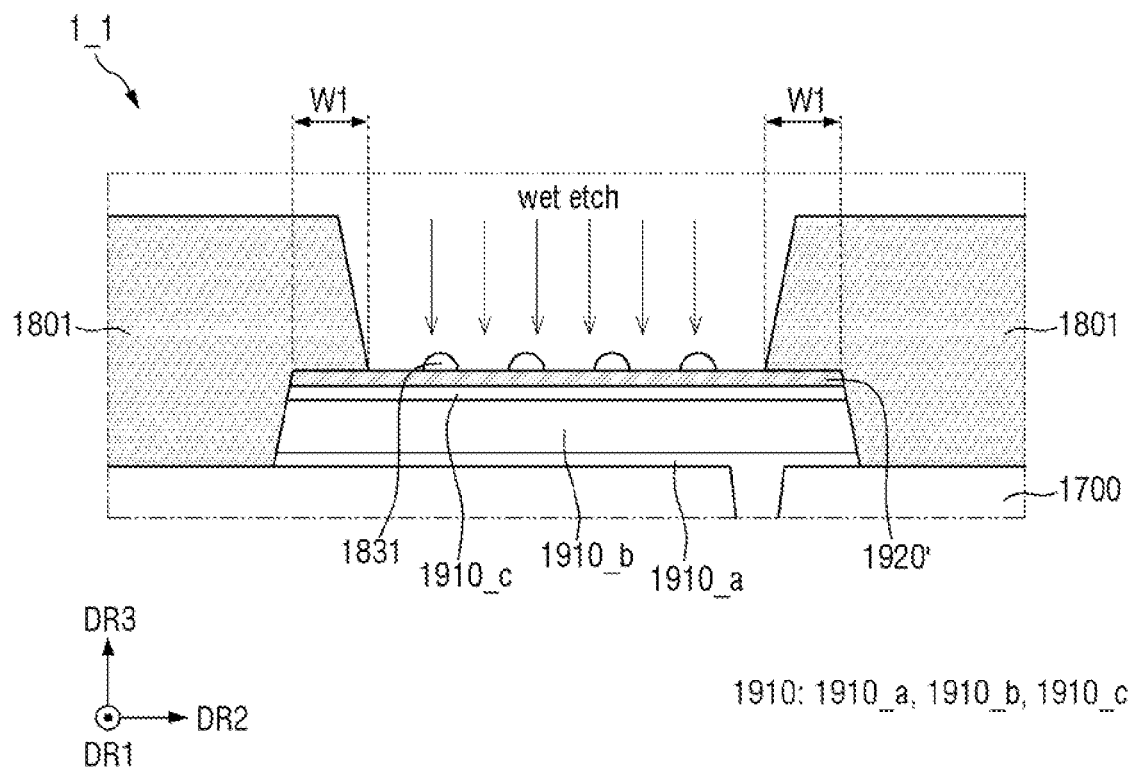
FIGS. 15 to 17 are cross-sectional views that illustrate processing steps of fabricating a display device shown in FIG. 14.
Figure 16:
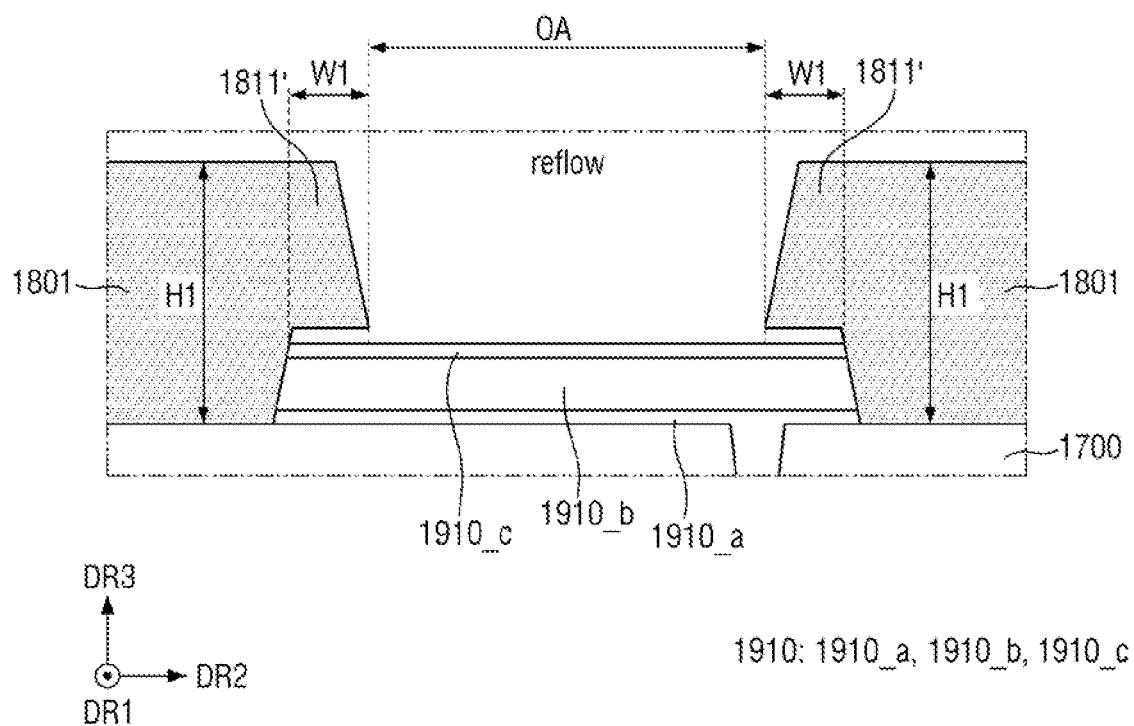
Figure 17:
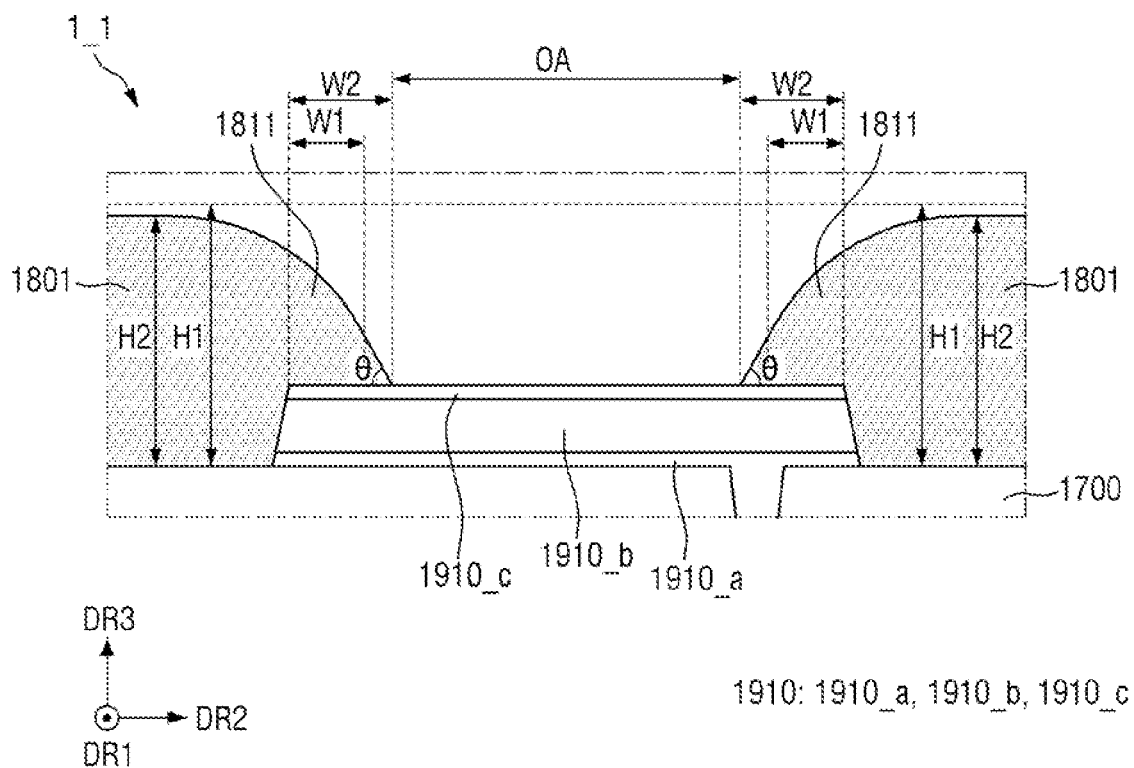

FIGS. 15 to 17 are cross-sectional views that illustrate process steps of fabricating a display device shown in FIG. 14.

Referring to FIGS. 15 to 17, in an embodiment, a swelling prevention material layer 1920' exposed by the pixel-defining layer 1801 is entirely etched, and a reflow process is performed by applying heat to the pixel-defining layer 1801. For example, the swelling prevention material layer 1920' is etched by wet etching, and the reflow process is performed at a temperature higher than 250° C.

When the swelling prevention material layer 1920' is etched, the organic residues 1831 disposed on the upper surface of the swelling prevention layer 1920 exposed by the pixel-defining layer 1801 are removed together time the swelling prevention layer 1920. Accordingly, an empty space is formed between the pixel-defining layer 1801 and the first electrode 1910, and an undercut structure is formed between the pixel-defining layer 1801 and the first electrode 1910.

The pixel-defining layer 1801 includes an undercut region 1811' that extends in the second direction DR2 into the pixel-defining layer 1801 from the opening OA and overlaps the first electrode 1910 in the third direction DR3 and. Since the swelling prevention material layer 1920' is completely removed, the maximum width W1 of the undercut region 1811' in the second direction DR2 can be reduced, so that the width of the upper surface of the swelling prevention metal material layer 1920' exposed by the pixel-defining layer 1801, i.e., the width of the opening OA, can be made as large as possible.

After etching the swelling prevention material layer 1920' exposed by the pixel-defining layer 1801, a reflow process is performed. The empty space between the pixel-defining layer 1801 and the first electrode 1910 is filled with the pixel-defining layer 1800 by the reflow process. Accordingly, the undercut region 1811' is converted into the overlapping region 1811, and the overlapping region 1811 of the pixel-defining layer 1800 is in direct contact with the upper surface of the first electrode 1910. The width W2 of the overlapping region 1811 in contact with the upper surface of the third layer 1910_c of the first electrode 1910 in the second direction DR2 is greater than the maximum width W1 of the undercut region 1811' in the second direction DR2.

Figure 18:
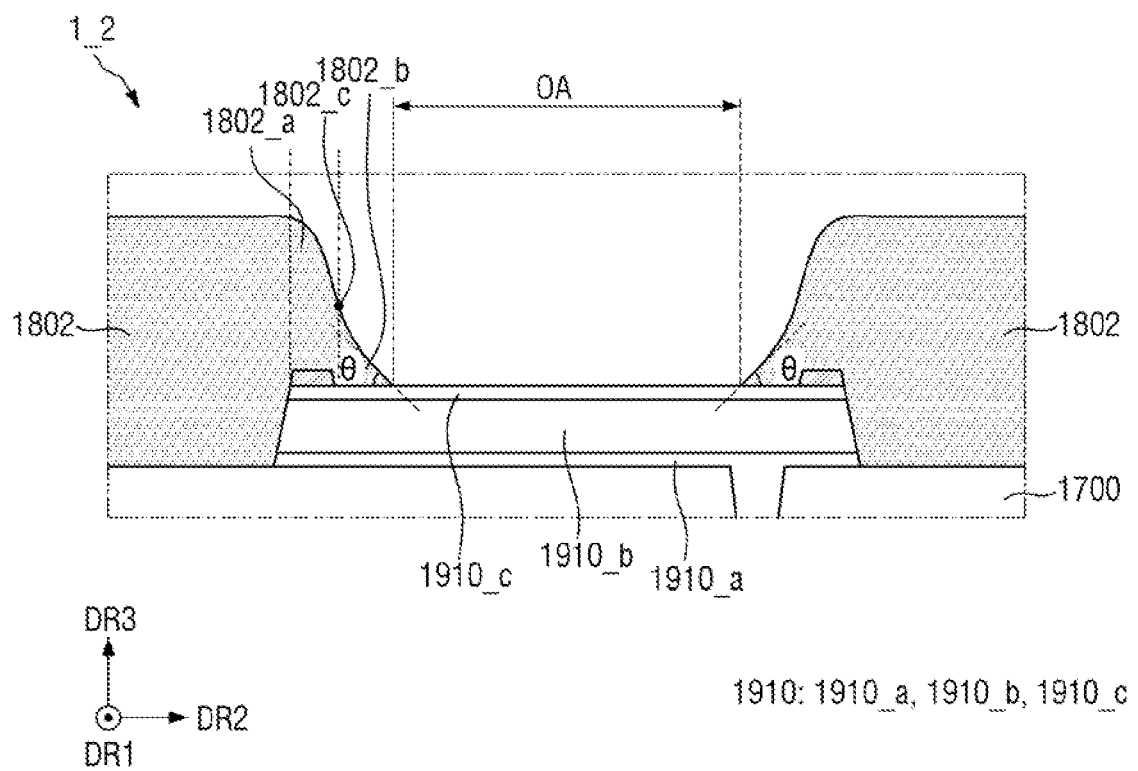
FIG. 18 is a cross-sectional view of a first electrode and a pixel-defining layer of a display device according to an embodiment.

FIG. 18 is a cross-sectional view of a first electrode and a pixel-defining layer of a display device according to an embodiment.

In an embodiment shown in FIG. 18, the side profile of the pixel-defining layer 1802 of the display device 1-2 adjacent to an opening OA has a profile that includes an inflection point 1802_c. Specifically, the pixel-defining layer 1802 includes a slope increasing region 1802_a and a slope decreasing region 1802_b. The inflection point 1802_c is the boundary between the slope increasing region 1802_a and the slope decreasing region 1802_b.

The side profile of the pixel-defining layer 1802 with an inflection point 1802_c results from reflow process conditions. For example, when the thickness of the pixel-defining layer 1802 is large, e.g., about 1 μm to about 1.5 μm or more, the side profile of the pixel-defining layer 1802 has the inflection point 1802_c due to the reflow process. The side profile of the pixel-defining layer 1802 is also substantially similar to that of the structure of FIG. 35, which will be described below.

The pixel-defining layer 1802 has slope decreasing regions 1802_a and 1802_b on each side of the opening. On each side, the slope decreasing region 1802_b is disposed between the slope increasing region 1802_a and the opening OA, and is disposed closer in the second direction DR2 to the center of the first electrode 1910 than the slope increasing region 1802_a. For example, the slope decreasing regions 1802_a and 1802_b are symmetric to each other with respect to a center of the opening OA. In the following description, the pixel-defining layer 1802 positioned at the one end of the first electrode 1910 in the second direction DR2 will be mainly described for convenience of illustration.

In the slope increasing region 1802_a of the pixel-defining layer 1802, the slope of the tangent line increases in the second direction DR2 as the upper surface of the pixel-defining layer 1802 approaches the inflection point 1802_c. On the other hand, in the slope decreasing region 1802_b, the slope of the tangent line decreases in the second direction DR2 as the upper surface of the pixel-defining layer 1802 approaches the opening OA. The angle θ between the upper surface of the first electrode 1910 and the tangent line at the end of the slope decreasing region 1802_b in the second direction DR2 at the point of contact of the upper surface of the pixel-defining layer 1802 and the upper surface of the first electrode 1910 is greater than 0° and less than or equal to 10°.

Figure 19:
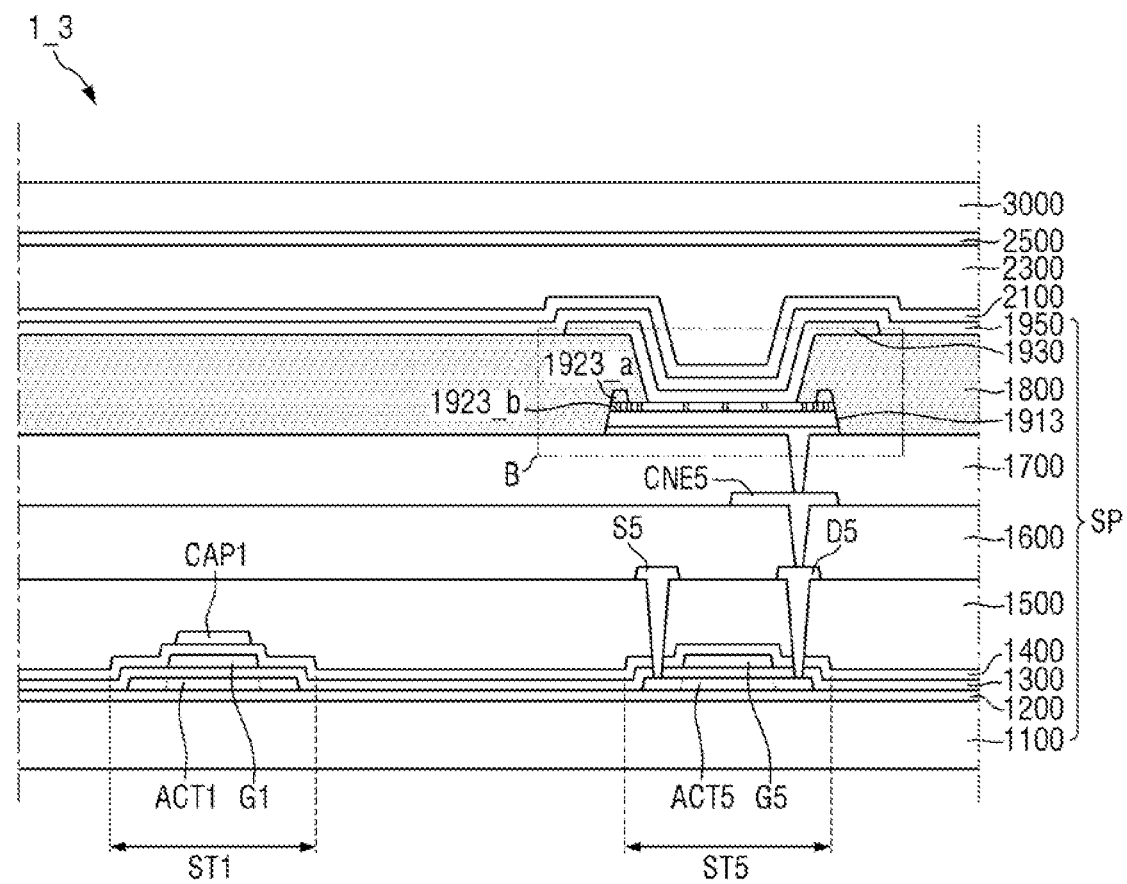
FIG. 19 is a cross-sectional view of a sub-pixel of a display device according to an embodiment of the disclosure.
Figure 20:
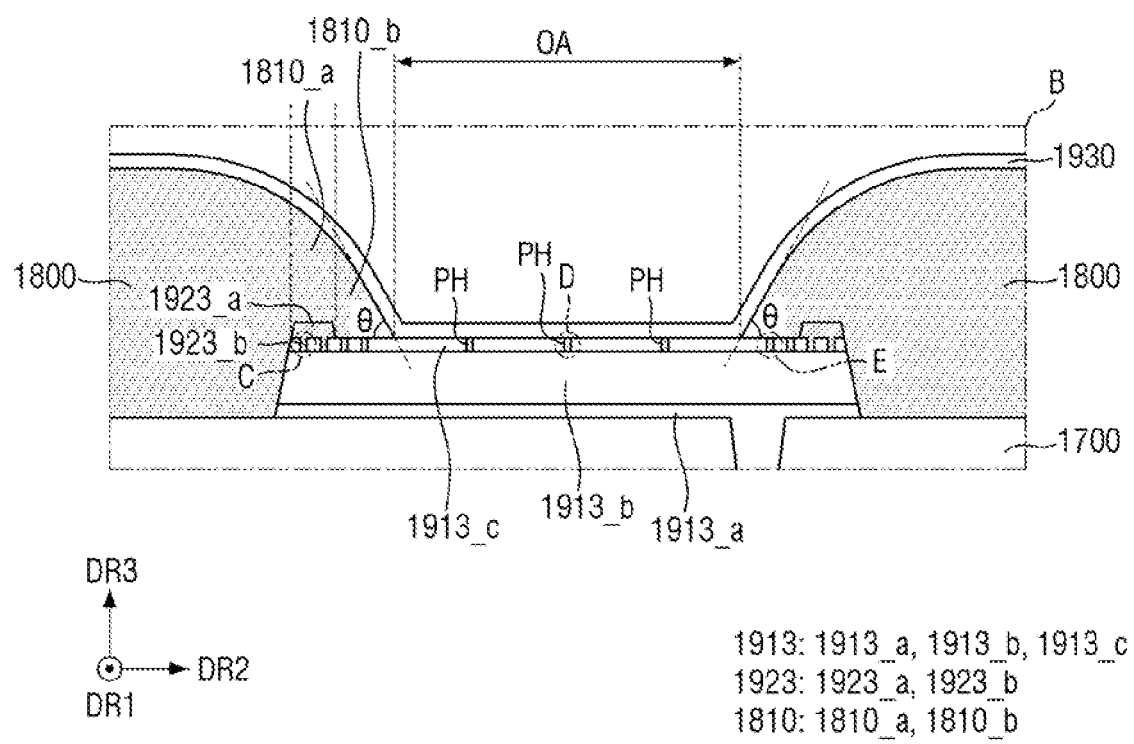
FIG. 20 is an enlarged view of area B of FIG. 19.
Figure 21:
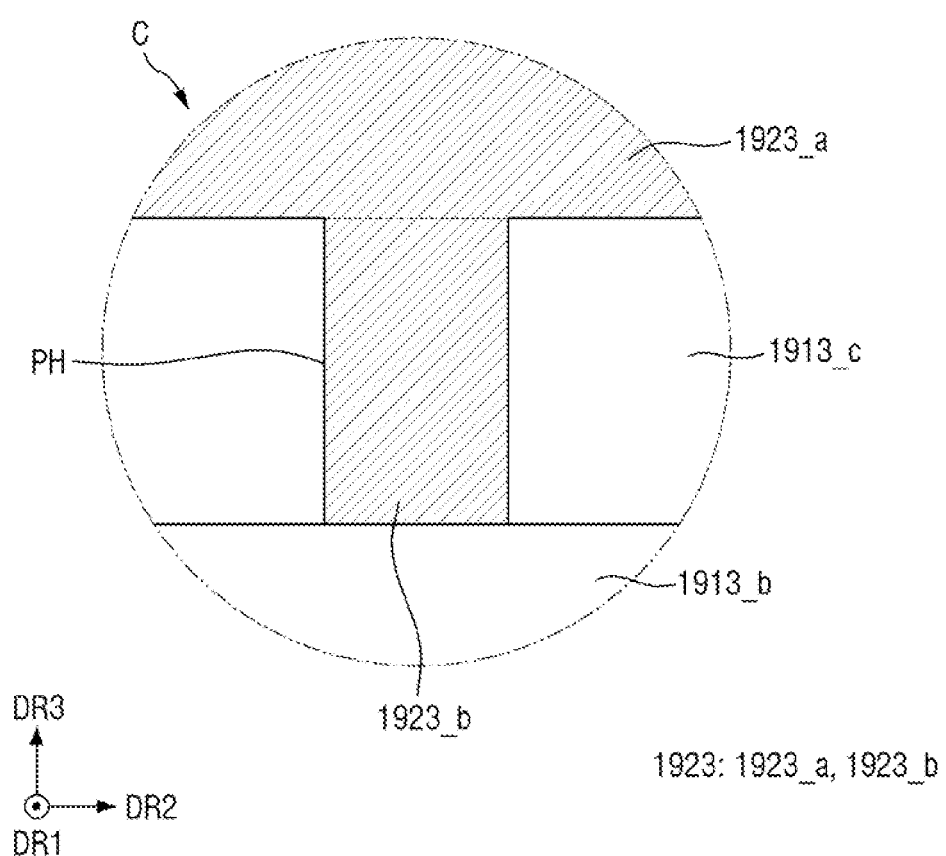
FIG. 21 is an enlarged view of area C of FIG. 20.
Figure 22:
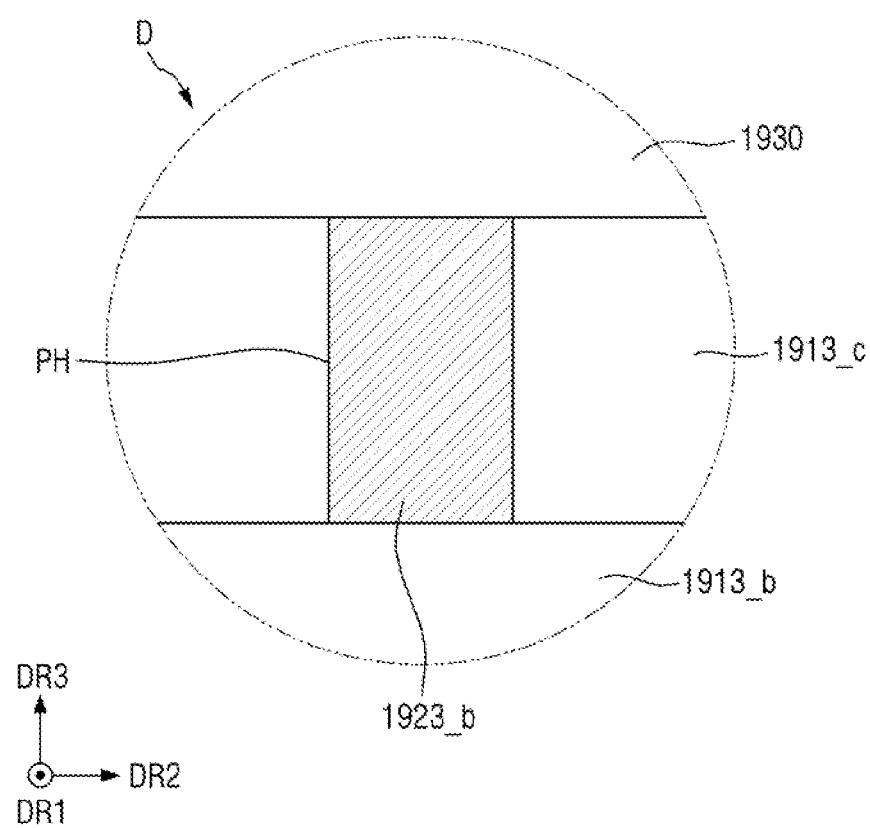
FIGS. 22 and 23 are enlarged views of area D of FIG. 20.
Figure 23:
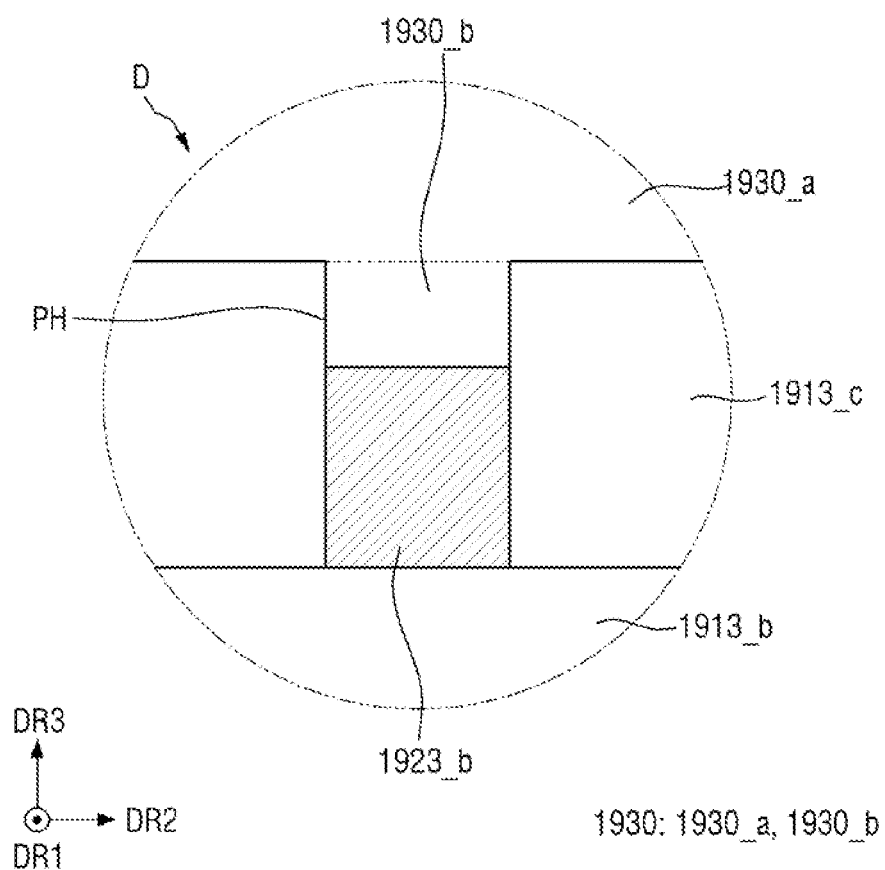
Figure 24:
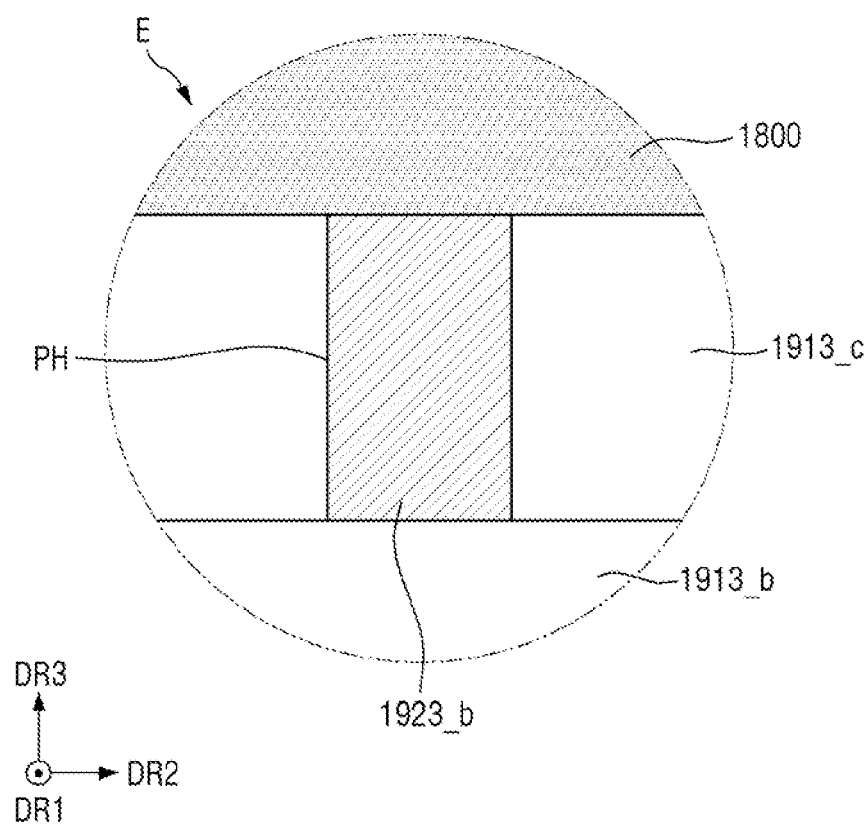
FIGS. 24 and 25 are enlarged views of area E of FIG. 20.
Figure 25:
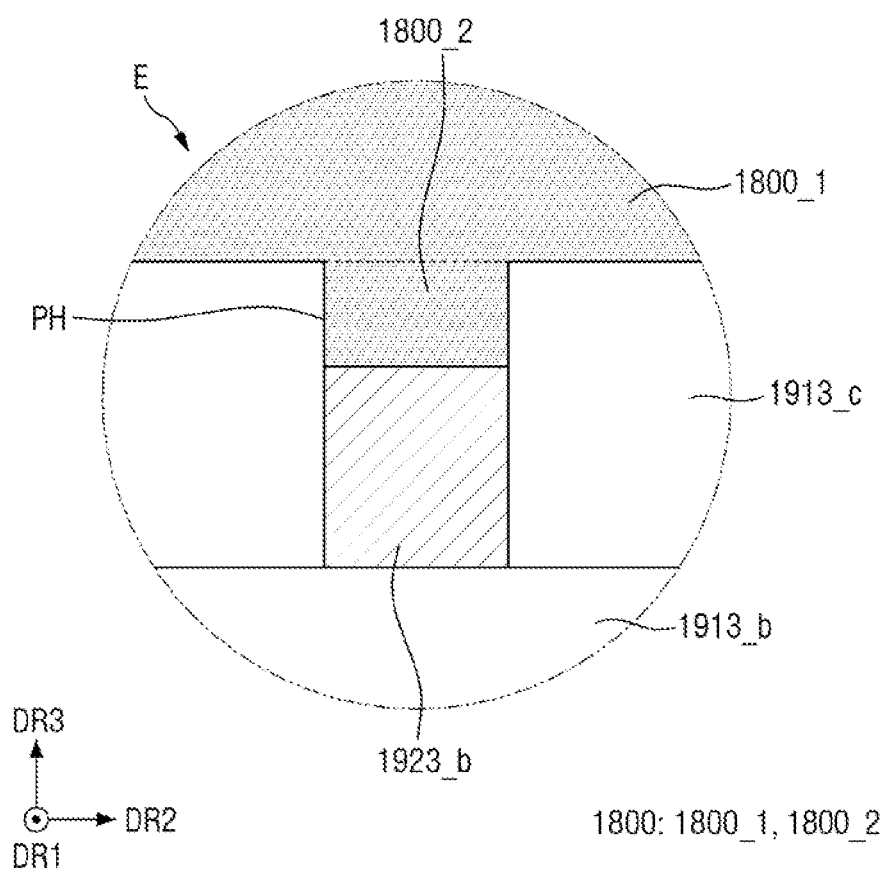

FIG. 19 is a cross-sectional view of a part of a sub-pixel of a display device according to an embodiment of the disclosure. FIG. 20 is an enlarged view of area B of FIG. 19. FIG. 21 is an enlarged view of area C of FIG. 20. FIGS. 22 and 23 are enlarged views of area D of FIG. 20. FIGS. 24 and 25 are enlarged views of area E of FIG. 20.

Hereinafter, the swelling prevention layer 1923, the first electrode 1913 of the light-emitting element LEL, and the pixel-defining layer 1800 will be described in detail with reference to FIGS. 19 and 20. For convenience of illustration, elements other than the second via insulating layer 1700, the first electrode 1913 of the light-emitting element LEL, the swelling prevention layer 1923, the emissive layer 1930 and the pixel-defining layer 1800 are not depicted in FIG. 20.

In an embodiment shown in FIGS. 19 and 20, a third layer 1913_c of a first electrode 1913 of a display device 1_3 includes pin holes PH, and a second swelling prevention layer 1923_b is disposed inside the pin holes PH. Specifically, a plurality of pin holes PH that penetrate the third layer 1913_c in the third direction DR3 are formed in the third layer 1913_c. The swelling prevention layer 1923 includes a first swelling prevention layer 1923_a disposed at both ends of the upper surface of the third layer 1913_c in the second direction DR2, and a second swelling prevention layer 1923_b disposed inside the pin holes PH formed in the third layer 1913_c.

The pin holes PH form during a process of fabricating the display device 1_3 according to an embodiment of FIG. 19 to be described below. The pin holes PH are fine holes that penetrate the third layer 1913_c in the third direction DR3. In some embodiments, the pin holes PH extend parallel to the third direction DR3, but embodiments of the disclosure are not limited thereto. In some embodiments, the pin holes PH are substantially disposed at both ends of the third layer 1913_c in the second direction DR2, but embodiments of the disclosure are not limited thereto. In some embodiments, the pin holes PH are formed in the central portion of the third layer 1913_c as well. The pin holes PH are filled with the second swelling prevention layer 1923_b.

The swelling prevention layer 1923 is a residue that remains after the swelling prevention material layer 1923', shown in FIG. 31, has been etched during a process of fabricating a display device, which will be described below. A part of the swelling prevention material layer 1923' is disposed inside the pin holes PH to prevent swelling of the second layer 1913_b that can occur during a process of disposing the pixel-defining layer 1800. If none of the swelling prevention material layer 1923' is disposed inside the pin holes PH, the second layer 1913_b can penetrate the third layer 1913_c through the pin holes PH and swell in a process of disposing the pixel-defining layer 1800. Accordingly, the second layer 1913_b can be prevented from swelling through the pin holes PH by disposing a part of the swelling prevention material layer 1923' inside the pin holes PH. As described above, the swelling prevention layer 1923 includes a material that differs from that of the first electrode 1910.

In some embodiments, the second swelling prevention layer 1923_b fills the entire inside of the pin holes PH, but embodiments of the disclosure are not limited thereto. In an embodiment, the second swelling prevention layer 1923_b does not necessarily fill the entire inside of the pin holes PH.

Referring to FIG. 21, in an embodiment, a pin hole PH located under the first region 1810_a of the pixel-defining layer 1800 and that overlaps the first swelling prevention layer 1923_a in the third direction DR3 is entirely filled with the second swelling prevention layer 1923_b. In an embodiment, the second swelling prevention layer 1923_b and the first swelling prevention layer 1923_a are integrally connected.

Referring to FIGS. 22 and 23, in some embodiments, a pin hole PH located in the opening OA and in direct contact with the emissive layer 1930 may be entirely filled with the second swelling prevention layer 1923_b, or may be filled with the second swelling prevention layer 1923_b as well as the emissive layer 1930 together. For example, the pin hole PH is partially filled with the swelling prevention layer 1923_b, and the remainder of the pin hole PH is filled with the emissive layer 1930.

As shown in FIG. 22, in an embodiment, when the pin hole PH s entirely filled with the second swelling prevention layer 1923_b, one side of the second swelling prevention layer 1923_b in the third direction DR3 is direct contact with the emissive layer 1930.

When the pin hole PH is filled with both the second swelling prevention layer 1923_b as well as the emissive layer 1930 as shown in FIG. 23, the pin hole PH is partially filled with the second swelling prevention layer 1923_b. This happen when a part of the second swelling prevention layer 1923_b is etched along with the first swelling prevention layer 1923_a in a process of etching the swelling prevention layer during a process of fabricating the display device 1_3 of FIG. 19 to be described below. The emissive layer 1930 includes a first emissive layer 1930_a not disposed inside the pin hole PH and a second emissive layer 1930_b disposed inside the pin hole PH. In the pin hole PH, one side surface of the second swelling prevention layer 1923_b in the third direction DR3 is in direct contact with an opposite side surface of the second emissive layer 1930_b in the third direction DR3, and one side surface of the second emissive layer 1930_b in the third direction DR3 is connected to the opposite side surface of the first emissive layer 1930_a in the third direction DR3.

Referring to FIGS. 24 and 25, in some embodiments, a pin hole PH located under the second region 1810_b of the pixel-defining layer 1800 and in direct contact with the pixel-defining layer 1800 may be entirely filled with the second swelling prevention layer 1923_b, or may be filled with both the second swelling prevention layer 1923_b and the pixel-defining layer 1800.

As shown in FIG. 24, in an embodiment, if the pin hole PH is entirely filled with the second swelling prevention layer 1923_b, one side of the second swelling prevention layer 1923_b in the third direction DR3 is in direct contact with the pixel-defining layer 1800.

As shown in FIG. 25, in an embodiment, if the pin hole PH is filled with both the second swelling prevention layer 1923_b as well as a part of the pixel-defining layer 1800, the pin hole PH is partially filled with the second swelling prevention layer 1923_b, and the remainder of the pin hole PH is filled with the pixel-defining layer 1800. This can happen when a part of the second swelling prevention layer 1923_b is etched as along with the first swelling prevention layer 1923_a in a process of etching the swelling prevention layer during a process of fabricating the display device 1_3 of FIG. 19 to be described below. The pixel-defining layer 1800 includes a first pixel-defining layer 1800_1 in direct contact with the upper surface of the third layer 1913_c, and a second pixel-defining layer 1800_2 disposed inside the pin hole PH. In the pin hole PH, one side surface of the second swelling prevention layer 1923_b in the third direction DR3 is in direct contact with the opposite side surface of the second pixel-defining layer 1800_2 in the third direction DR3, and one side surface of the second pixel-defining layer 1800_2 in the third direction DR3 is connected to the opposite side surface of the first pixel-defining layer 1800_1 in the third direction DR3.

Hereinafter, a method of fabricating the display device 1_3 according to an embodiment of FIG. 19 will be described. A process of forming the substrate 1100, the buffer layer 1200, the semiconductor layer ACTL, the first gate insulating layer 1300, the first conductive layer CDL1, the second gate insulating layer 1400, the second conductive layer CDL2, the first interlayer dielectric layer 1500, the third conductive layer CDL3, the first via insulating layer 1600, the fourth conductive layer CDL4 and the second via insulating layer 1700 shown in FIG. 4 is well known in the art; and, therefore, a description will be omitted.

FIGS. 26 to 33 are cross-sectional views that illustrate processing steps of fabricating the display device shown in FIG. 19.

Figure 26:
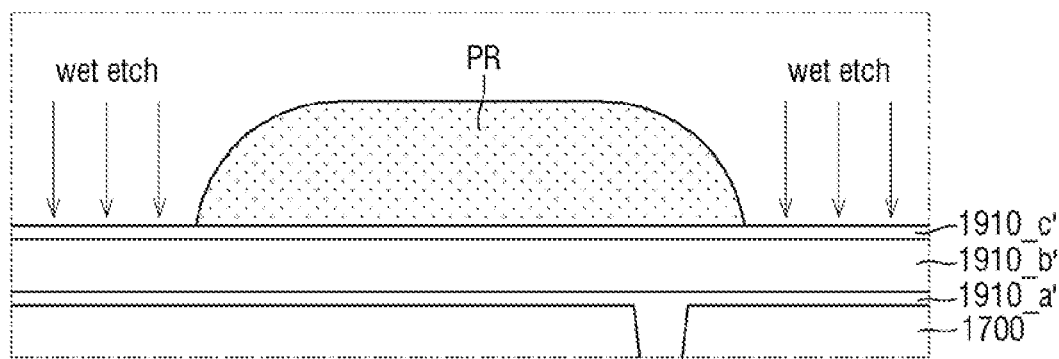
FIGS. 26 to 33 are cross-sectional views that illustrate processing steps of fabricating a display device shown in FIG. 19.
Figure 26:
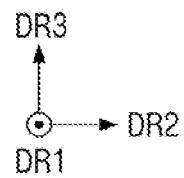
Figure 27:
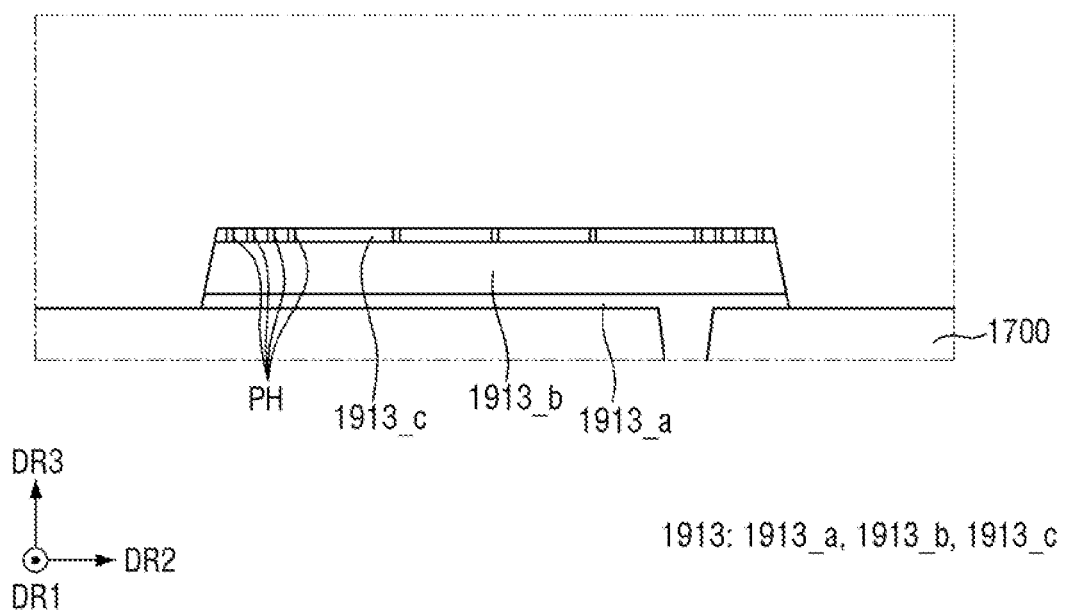

Referring to FIGS. 26 and 27, in an embodiment, a substrate 1100 is prepared on which a second via insulating layer 1700 is disposed, a first material layer 1913_a', a second material layer 1913_b' and a third material layer 1913_c' are sequentially formed on the second via insulating layer 1700, a photoresist pattern PR is formed on the third material layer 1913_c', both ends of the first material layer 1913_a', the second material layer 1913_b' and the third material layer 1913_c' in the second direction DR2 are patterned using the photoresist pattern PR as an etch stop layer to form a first layer 1913_a, a second layer 1913_b and a third layer 1913_c, and a first electrode 1913 that includes the first layer 1913_a, the second layer 1913_b and the third layer 1913_c is formed.

A process of forming the photoresist pattern PR on the third material layer 1913_c' and patterning both ends of the first material layer 1913_a', the second material layer 1913_b' and the third material layer 1913_c' in the second direction DR2 using the photoresist pattern PR as an etch stop layer include, for example, applying a photosensitive organic material on the third material layer 1913_c', performing exposure and development to form the photoresist pattern PR on the third material layer 1913_c', and patterning both ends of the first material layer 1913_a', the second material layer 1913_b' and the third material layer 1913_c' in the second direction DR2 using a wet etch process. In doing so, the etchant used for patterning both ends of the first material layer 1913_a', the second material layer 1913_b' and the third material layer 1913_c' in the second direction DR2 differs from the etchant used for patterning both ends of the fourth material layer 1923" in the second direction DR2, which will be described below.

When both ends of the first material layer 1913_a', the second material layer 1913_b' and the third material layer 1913_c' in the second direction DR2 are patterned by a wet etching process, the etchant used passes through the photoresist pattern PR to reach the third layer 1913_c, and thus pin holes PH that penetrate the third layer 1913_c in the third direction DR3 can form in the third layer 1913_c. During a process of disposing the pixel-defining layer 1800 to be described below, the second layer 1913_b can swell through the pin holes PH to create dark spots. Therefore, the second layer 1913_b can be prevented from swelling by filling the pin holes PH.

In some embodiments, the first material layer 1913_*a*' includes indium tin oxide, the second material layer 1913_*b*' includes silver, and the third material layer 1913_*c*' includes indium tin oxide. However, embodiments of the disclosure are not limited thereto. According to embodiments of the disclosure, the first material layer 1913_*a*' and the third material layer 1913_*c*' include various transparent conductive oxides as described above, and the second material layer 1913_*b*' includes the above-described various reflective metal materials.

The first material layer 1913_*a*' includes substantially the same material as the first layer 1913_*a*, the second material layer 1913_*b*' includes substantially the same material as the second layer 1913_*b*, and the third material layer 1913_*c*' includes substantially the same material as the third layer 1913_*c*.

Figure 28:
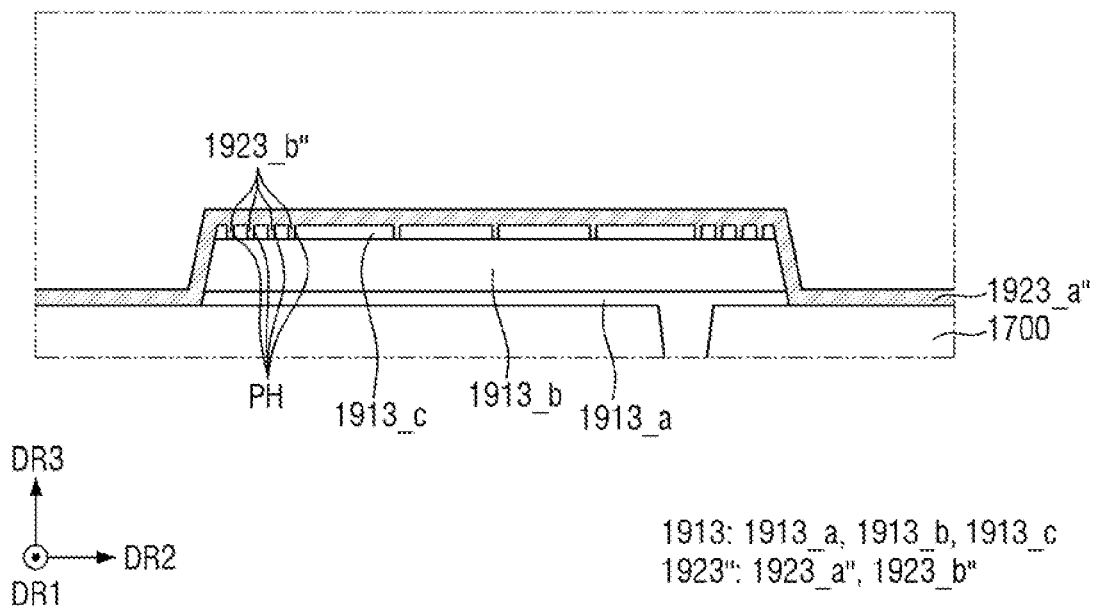

Referring to FIG. 28, in an embodiment, a fourth material layer 1923" is formed on the first electrode 1913. The fourth material layer 1923" includes a (4_2) layer 1923_*b*" disposed inside the pin holes PH, and a (4_1) layer 1923_*a*" not disposed inside the pin holes PH. The (4_1) layer 1923_*a*" and the (4_2) layer 1923_*b*" are connected with each other. In an embodiment, the (4_1) layer 1923_*a*" and the (4_2) layer 1923_*b*" are integrally connected with each other.

Figure 29:
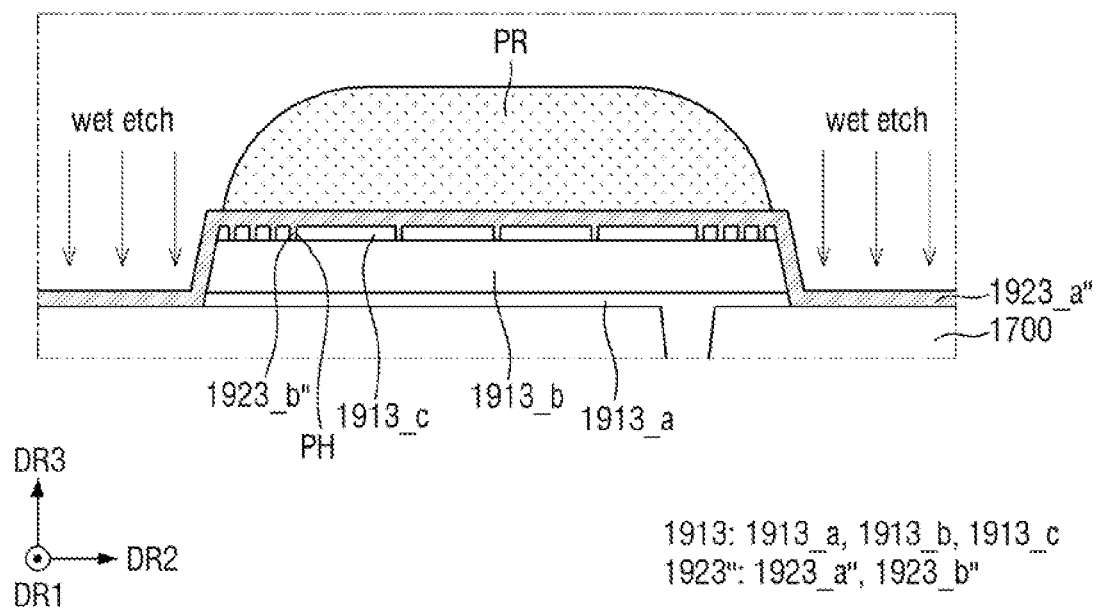

Referring to FIG. 29, in an embodiment, a photoresist pattern PR is formed on the (4_1) layer 1923_*a*," and both ends of the (4_1) layer 1920_*a*" in the second direction DR2 are patterned using the photoresist pattern PR as an etch stop layer, to form the swelling prevention material layer 1923'. For example, a photosensitive organic material is disposed on the (4_1) layer 19231*a*", and is exposed to light and developed to form the photoresist pattern PR on the (4_1) layer 1923_*a*". Both ends of the (4_1) layer 1920_*a*" in the second direction DR2 are patterned via a wet etch process.

The swelling prevention material layer 1923 includes a second swelling prevention material layer 1923_*b* disposed inside the pin holes PH, and a first swelling prevention material layer 1923_*a*' not disposed inside the pin holes PH. The first swelling prevention material layer 1923_*a*' and the second swelling prevention material layer 1923_*b*' are connected with each other. In an embodiment, the first swelling prevention material layer 1923_*a*' and the second swelling prevention material layer 1923_*b*' are integrally connected with each other.

Figure 30:
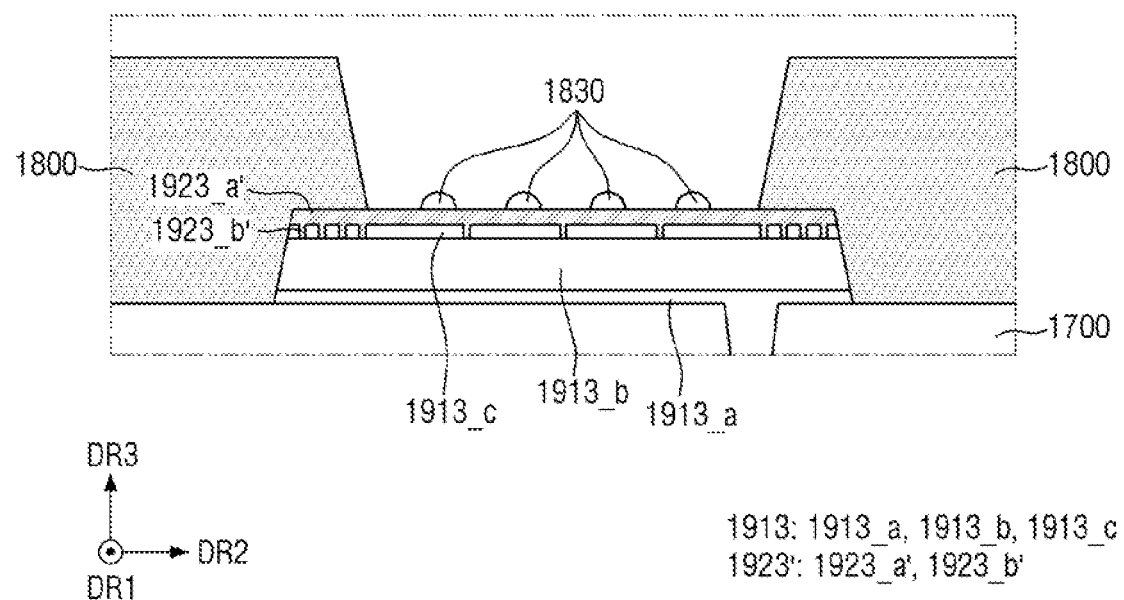

Referring to FIG. 30, in an embodiment, a pixel-defining layer 1800 is formed on the first electrode 1913 and the first swelling prevention material layer 1923_*a*'. The pixel-defining layer 1800 includes a photosensitive organic material. The photosensitive organic material is disposed on the entire first electrode 1913 and the first swelling prevention material layer 1923_*a*', and is exposed to light and developed. Accordingly, the photosensitive organic material is patterned so that a part of the upper surface of the first swelling prevention material layer 1923_*a*' is exposed, to form the pixel-defining layer 1800.

During a process of exposing the photosensitive organic material to light, and developing and patterning it, a part of the photosensitive organic material can remain on the upper surface of the first swelling prevention material layer 1923_*a*' to create organic residues 1830. The organic residues 1830 are located on the upper surface of the first swelling prevention layer 1923_*a* exposed by the pixel-defining layer 1800. The organic residues 1830 can lower the emission efficiency of the light-emitting element LEL, and are thus removed.

Figure 31:
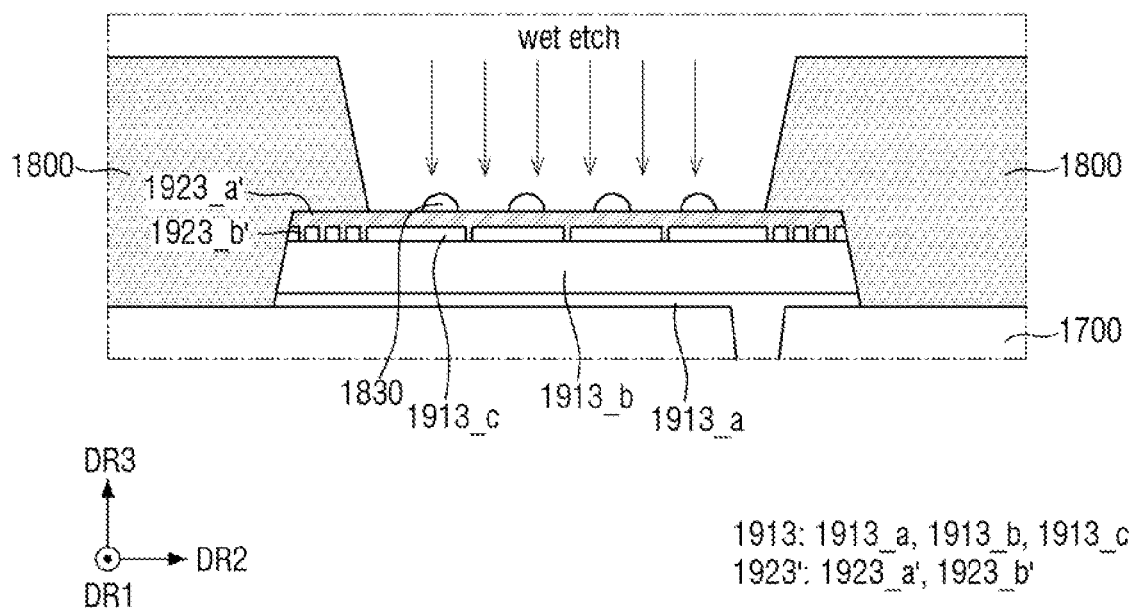
Figure 32:
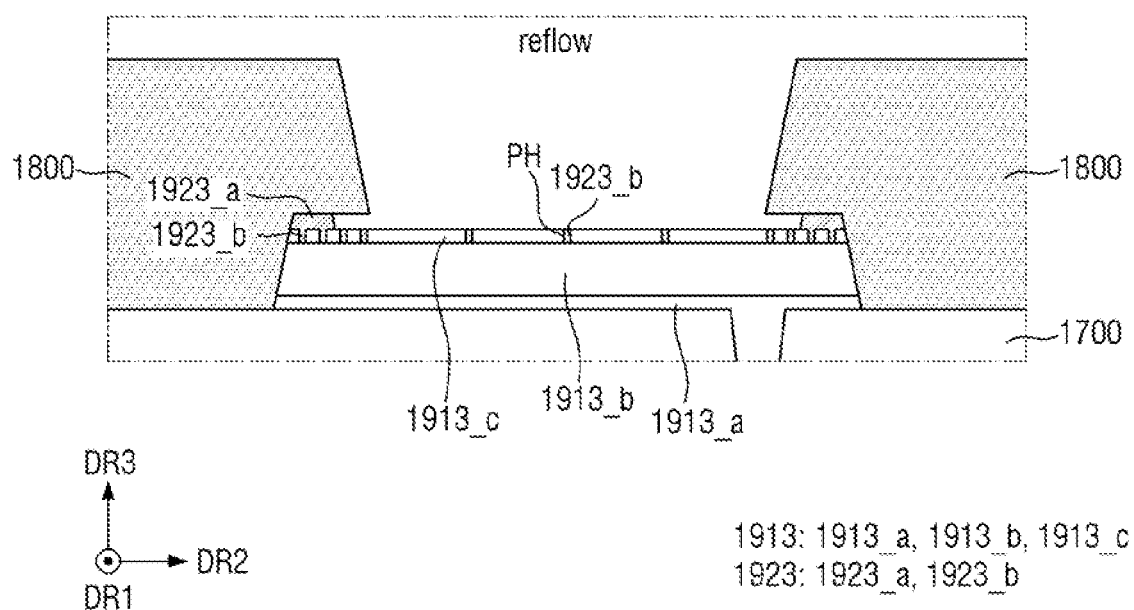
Figure 33:
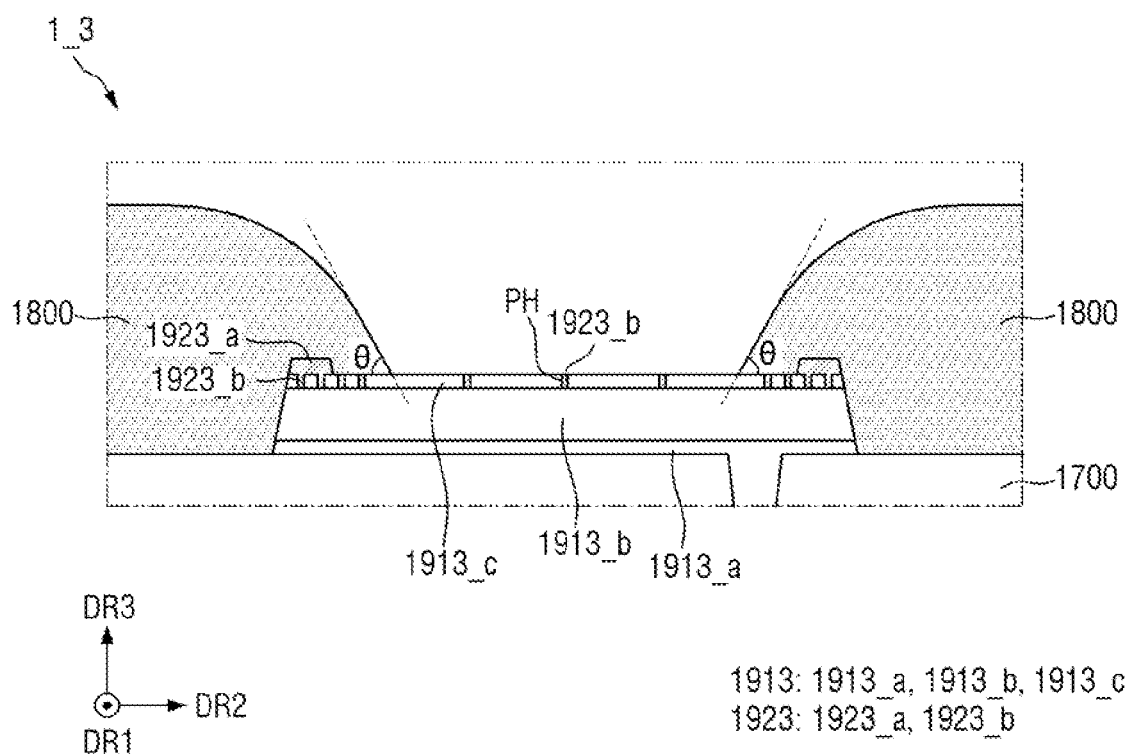

Referring to FIGS. 31 to 33, in an embodiment, the swelling prevention material layer 1923' exposed by the pixel-defining layer 1800 is etched to form a swelling prevention layer 1923, and a reflow process is performed by applying heat to the pixel-defining layer 1800. For example, the first swelling prevention material layer 1923_*a*' is etched by wet etching, and the reflow process is performed at a temperature higher than 250° C.

During a process of etching the swelling prevention material layer 1923', the first swelling prevention material layer 1923_*a*' is etched to form the swelling prevention layer 1923. The swelling prevention layer 1923 includes a second swelling prevention layer 1923_*b* disposed inside the pin holes PH, and a first swelling prevention layer 1923_*a* not disposed inside the pin holes PH. The first swelling prevention layer 1923_*a* is a residue that remains after the first swelling prevention material layer 1923_*a*' has been etched, and the second swelling prevention layer 1923_*b* is substantially the same as the second swelling prevention material layer 1923_*b*'.

In some embodiments, a process of etching the swelling prevention material layer 1923' includes specifically etching the first swelling prevention layer 1923_*a*, but embodiments of the disclosure are not limited thereto. In some embodiments, in a process of etching the swelling prevention material layer 1923', a part of the second swelling prevention material layer 1923_*b*' is etched as along with the first swelling prevention layer 1923_*a*. When a part of the second swelling prevention material layer 1923_*b*' is also etched, the second swelling prevention layer 1923_*b* is a residue that remains after the second swelling prevention material layer 1923_*b*' has been etched. Accordingly, as shown in FIGS. 23 and 25, the second swelling prevention layer 1923_*b* fills only a part of the inside of the pin holes PH.

The emissive layer 1930 is formed after the reflow process on the pixel-defining layer 1800 and the upper surface of the first electrode 1913 exposed by the pixel-defining layer 1800, and a second electrode 1950 is formed on the emissive layer 1930, to form a sub-pixel SP. As a result, the structure of the sub-pixel SP as shown in FIG. 19 can be formed.

Figure 34:
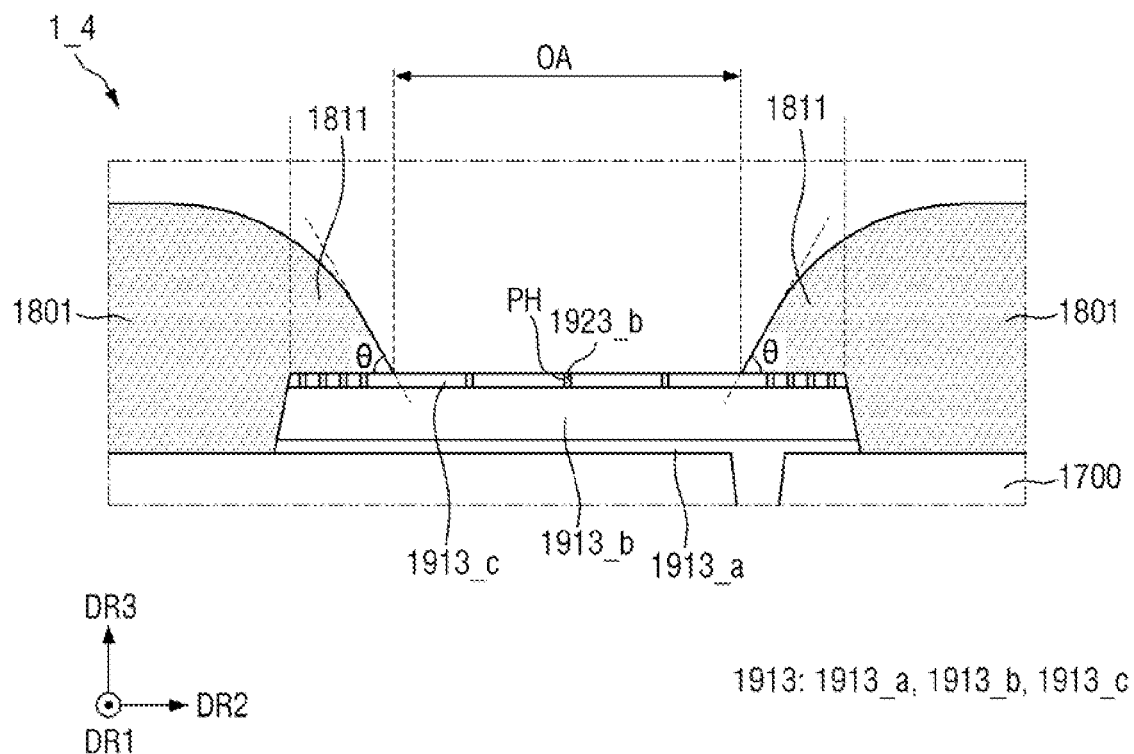
FIG. 34 is a cross-sectional view of a first electrode and a pixel-defining layer of a display device according to an embodiment.

FIG. 34 is a cross-sectional view of a first electrode and a pixel-defining layer of a display device according to an embodiment.

In an embodiment shown in FIG. 34, the entire overlapping region 1811 of a pixel-defining layer 1801 of a display device 1_4 is in direct contact with the upper surface of a first electrode 1913. Specifically, no first swelling prevention layer 1923_*a* is disposed between the pixel-defining layer 1801 and the first electrode 1913. This may be because the first swelling prevention layer 1923_*a* has been entirely etched during the etching process. Since the pixel-defining layer 1812 according to an embodiment is substantially identical to that described above with reference to FIG. 14; a redundant descriptions will be omitted.

Figure 35:
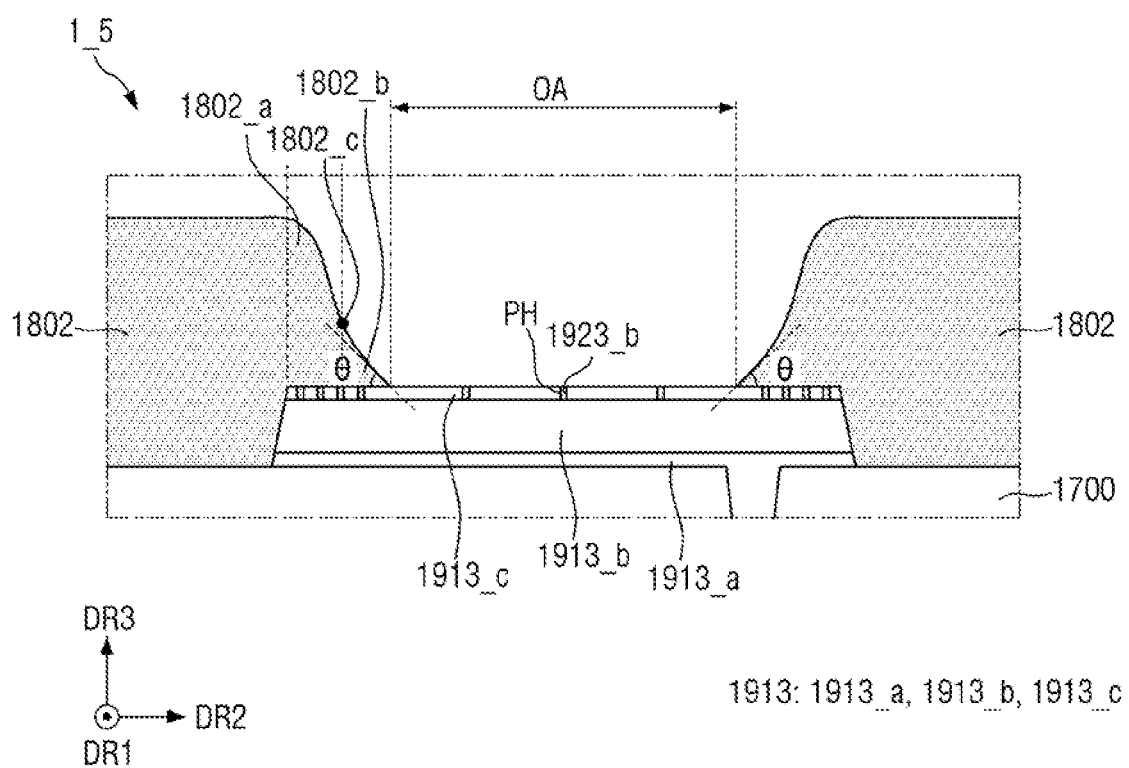
FIG. 35 is a cross-sectional view of a first electrode and a pixel-defining layer of a display device according to an embodiment.

FIG. 35 is a cross-sectional view of a first electrode and a pixel-defining layer of a display device according to an embodiment.

In an embodiment shown in FIG. 35, the side profile of the pixel-defining layer 1802 of the display device 1_5 includes an inflection point 1802_*c*. Specifically, the pixel-defining layer 1802 includes a slope increasing region 1802_*a* and a slope decreasing region 1802_*b*. Since the pixel-defining layer 1802 according to an embodiment is substantially identical to that described above with reference to FIG. 18; a redundant descriptions will be omitted.

What is claimed is:

1. A display device, comprising:
   a substrate;
   a thin-film transistor disposed on the substrate;
   a via insulating layer disposed above the thin-film transistor;
   a first electrode disposed on the via insulating layer and electrically connected to the thin-film transistor;
   a pixel-defining layer disposed on the via insulating layer and on the first electrode, wherein the pixel-defining layer includes an opening that partially exposes an upper surface of the first electrode; and
   a first swelling prevention layer disposed on one end of the upper surface of the first electrode but not on a side surface of the first electrode and interposed between the first electrode and the pixel-defining layer,
   wherein the pixel-defining layer comprises a first region that overlaps the first swelling prevention layer and the first electrode, and a second region that overlaps the first electrode but not the first swelling prevention layer,
   wherein the second region of the pixel-defining layer is in direct contact with the upper surface of the first electrode, and
   wherein a part of the upper surface of the first electrode in contact with the pixel-defining layer is made of a material that differs from a material of the first swelling prevention layer.

2. The display device of claim 1,
   wherein the first electrode comprises a first layer disposed on the via insulating layer, a second layer disposed on the first layer, and a third layer disposed on the second layer,
   wherein the first layer and the third layer comprise a transparent conductive oxide,
   wherein the second layer comprises a reflective metal, and
   wherein the first swelling prevention layer is made of a material that differs from a material of the third layer.

3. The display device of claim 2,
   wherein the first layer and the third layer comprise indium tin oxide,
   wherein the second layer comprises silver (Ag), and
   wherein the first swelling prevention layer comprises one of indium zinc oxide or indium gallium zinc oxide.

4. The display device of claim 3,
   wherein the pixel-defining layer comprises a light-absorbing material.

5. The display device of claim 2,
   wherein an angle formed between an upper surface of the third layer and a tangent line at a point where an upper surface of the pixel-defining layer makes direct contact with the upper surface of the third layer is greater than 0° and less than or equal to 10°.

6. The display device of claim 2,
   wherein the third layer comprises a pin hole that penetrates through the third layer, and wherein the display device further comprises a second swelling prevention layer disposed inside the pin hole.

7. The display device of claim 6,
   wherein the second swelling prevention layer is made of a material that differs from the material of the third layer.

8. The display device of claim 1,
   wherein a surface of the pixel-defining layer adjacent to the opening has a profile the includes an inflection point.

9. The display device of claim 8,
   wherein the pixel-defining layer comprises a slope increasing region in which a slope of an upper surface of the pixel-defining layer increases toward the first electrode, and a slope decreasing region in which the slope of the upper surface of the pixel-defining layer decreases toward the first electrode, wherein the slope decreasing region is disposed between the slope increasing region and the opening and is closer to a center of the first electrode, and
   wherein the inflection point is a boundary between the slope increasing region and the slope decreasing region.

10. The display device of claim 9,
    wherein an angle formed between the upper surface of the first electrode and a tangent line at a point of contact of the upper surface of the pixel-defining layer and the upper surface of the first electrode where an end of the slope decreasing region is in direct contact with the upper surface of the first electrode is greater than 0° and less than or equal to 10°.

11. A display device, comprising:
    a substrate;
    a thin-film transistor disposed on the substrate;
    a via insulating layer disposed above the thin-film transistor;
    a first electrode disposed on the via insulating layer and electrically connected to the thin-film transistor; and
    a pixel-defining layer disposed on the via insulating layer and on a part of an upper surface of the first electrode,
    wherein the first electrode comprises a first layer disposed on the via insulating layer, a second layer disposed on the first layer, and a third layer disposed on the second layer,
    wherein the third layer comprises a plurality of pin holes that penetrate through the third layer, and
    wherein the display device comprises a first swelling prevention layer disposed inside the plurality of pin holes of the third layer.

12. The display device of claim 11,
    wherein the third layer and the first swelling prevention layer are made of different materials.

13. The display device of claim 12,
    wherein the first layer and the third layer comprise indium tin oxide,
    wherein the second layer comprises silver (Ag), and
    wherein the first swelling prevention layer comprises one of indium zinc oxide or indium gallium zinc oxide.

14. The display device of claim 13,
    wherein the pixel-defining layer comprises a light-absorbing material.

15. The display device of claim 11, further comprising:
    an emissive layer disposed on the third layer,
    wherein the plurality of pin holes comprises a first pin hole that overlap the emissive layer but not the pixel-defining layer, and
    wherein the first pin hole is filled with the first swelling prevention layer and a part of the emissive layer.

16. The display device of claim 15,
    wherein the plurality of pin holes comprises a second pin hole that overlaps the pixel-defining layer,
    wherein the pixel-defining layer comprises a first pixel-defining layer in contact with an upper surface of the third layer and a second pixel-defining layer disposed inside the second pin hole, and
    wherein the second pin hole is filled with the first swelling prevention layer and the second pixel-defining layer.

17. The display device of claim 16, further comprising:
a second swelling prevention layer disposed between the third layer and the pixel-defining layer and located at both ends of the upper surface of the third layer,
wherein the plurality of pin holes comprises a third pin hole that overlaps the second swelling prevention layer, and
wherein the first swelling prevention layer disposed inside the third pin hole is integrally connected with the second swelling prevention layer.

18. A display device, comprising:
a substrate;
a thin-film transistor disposed on the substrate;
a via insulating layer disposed above the thin-film transistor;
a first electrode disposed on the via insulating layer and electrically connected to the thin-film transistor; and
a pixel-defining layer disposed on the via insulating layer and on the first electrode, wherein the pixel-defining layer includes an opening that partially exposes a part of an upper surface of the first electrode,
wherein an upper surface of the pixel-defining layer adjacent to the opening has a profile that includes an inflection point.

19. The display device of claim 18,
wherein the pixel-defining layer comprises a slope increasing region in which a slope of the upper surface of the pixel-defining layer increases toward the first electrode, and a slope decreasing region in which the slope of the upper surface of the pixel-defining layer decreases toward the first electrode, wherein the slope decreasing region is disposed between the slope increasing region and the opening and is disposed closer to a center of the first electrode, and
wherein the inflection point is a boundary between the slope increasing region and the slope decreasing region.

20. The display device of claim 19,
wherein an angle formed between the upper surface of the first electrode and a line tangent to the upper surface of the pixel-defining layer at a point of contact between the of the upper surface of the pixel-defining layer and the upper surface of the first electrode where an end of the slope decreasing region is in direct contact with the upper surface of the first electrode is greater than 0° and less than or equal to 10°.

\* \* \* \* \*